United States Patent [19]
Chen et al.

[11] Patent Number: 6,018,754
[45] Date of Patent: *Jan. 25, 2000

[54] APPARATUS FOR FILTERING A SIGNAL UTILIZING RECURSION AND DECIMATION

[75] Inventors: Yung-Lung Chen, Taichung; Chiao-Yen Tai; Chein-Wei Jen, both of Hsinchu; Hwan-Rei Lee, Hsinchu Hsien, all of Taiwan

[73] Assignee: United Microelectronics Corp., Taiwan

[ * ] Notice: This patent is subject to a terminal disclaimer.

[21] Appl. No.: 09/197,688

[22] Filed: Nov. 23, 1998

Related U.S. Application Data

[62] Division of application No. 08/679,430, Jul. 8, 1996, Pat. No. 5,841,681.

[30] Foreign Application Priority Data

Apr. 10, 1996 [TW] Taiwan ................................. 85104197

[51] Int. Cl.[7] .............................. G06F 17/10; G06F 17/17
[52] U.S. Cl. ........................ 708/316; 708/313; 708/303
[58] Field of Search .................................... 708/303, 313, 708/316, 321

[56] References Cited

U.S. PATENT DOCUMENTS

| | | | |
|---|---|---|---|
| 4,389,538 | 6/1983 | White | 370/478 |
| 4,389,546 | 6/1983 | Glisson et al. | 379/88 |
| 4,410,955 | 10/1983 | Burke et al. | 364/718.01 |
| 4,450,533 | 5/1984 | Petit et al. | 364/724.13 |
| 4,766,561 | 8/1988 | Thompson et al. | 364/724.13 |
| 4,789,852 | 12/1988 | Bailey et al. | 341/50 |
| 4,835,723 | 5/1989 | Hansen | 364/724.1 |
| 5,272,656 | 12/1993 | Genereux | 364/724.19 |
| 5,436,940 | 7/1995 | Nguyen | 375/240 |
| 5,442,146 | 8/1995 | Bell et al. | 177/210 FP |

FOREIGN PATENT DOCUMENTS 2 180 114 A   3/1997   United Kingdom .

*Primary Examiner*—Tan V. Mai
*Attorney, Agent, or Firm*—Rabin & Champagne, P.C.

[57] ABSTRACT

Digital filter bank device that operates in a frequency-time hierarchically arranged, recursively fed back scheme based on the concept of decimation of a multi-speed-rate-operated system. The digital filter bank device operates in accordance with the computational requirement of summation of products for generating a filter output signal, and the computations are performed according to a software scheme based on a distributed arithmetic algorithm. The use of minimum hardware is enabled by a time-multiplexed scheme for both the implementation of the decimation and the distributed arithmetic principles of signal processing. The use of such a digital filter bank device results in a digital filter hardware architecture that has a significantly reduced semiconductor device die surface area.

25 Claims, 17 Drawing Sheets

APPARATUS FOR FILTERING A SIGNAL UTILIZING RECURSION AND DECIMATION

This is a Division of application Ser. No. 08/679,430, filed Jul. 8, 1996 U.S. Pat. No. 5,841,681.

BACKGROUND OF THE INVENTION

1. Field of the Invention

The invention relates in general to a structure for digital filter devices, and to the method of its operation. In particular, the invention relates to a digital filter bank device employing the principle of decimation in a multi-rate system and the use of a distributed arithmetic algorithm for design simplification and reduction of physical structural dimensions necessary for device implementation, as well as its corresponding method of operation in a time-multiplexed manner.

2. Technical Background

In the processing of audio and/or video signals, such as for speech, music, image and movies, digital signal processors (DSP) are frequently utilized to implement the necessary operations on digital data in processes such as storage into or retrieval out of signal storage media, transmission from a source to a destination, and broadcasting. DSPs are essentially independent processor integrated circuit chips that are driven by firmware programs. These processors are substantially dedicated to the sole purpose of digital signal processing and are therefore more expensive to fabricate. However, a DSP design does not grow physically larger when the signal the DSP processes increases in complexity in terms of, for example, the number and/or category of original signal sources. The complexity of the DSP operation is reflected in the software routines it is required to execute to process the signal.

Another scheme to process audio and/or video signals involves the use of banks of either analog or digital filters (more generally known as filter banks) to sub-divide an input signal into a number of groups of signals, each having a narrower frequency band than the original input. Each of these narrower frequency-band signals is normally derived from the original input signal, based on a general categorization, or on the specific characterization of its respective required processing emphasis.

For example, for an input signal having mixed speech and music sources, the filter-extracted portion of the speech frequency-weighted signal will normally have processing emphasis placed on speed recognition, while the music signal portion will require processing emphasis on musical signal synthesis, in addition to the compression processing required for both. Different signal processing schemes or algorithms will therefore be required in performing specific tasks on the respective portions of the signal derived from the original input by the filter bank device. This approach has an underlying drawback.

The general principle of employing different task-oriented algorithms for individually processing discrete portions of an input signal inevitably requires too many filter components in the filter bank that is used to break down the original input. The larger the number of filter-derived signals, the larger the number of required filters in the filter bank. For digital filters, multipliers, adders, and registers make up the principal building blocks. Unfortunately, a digital multiplier is complicated in structure, much more than either an adder or a register. Therefore, a product of this filter bank processing scheme is a filter bank device that has an excessive die surface area when implemented in a semiconductor device.

The underlying concept of conventional filter banks used in signal processing is briefly examined with reference to FIG. 1. FIG. 1 shows the block diagram of a conventional filter bank that can be used for processing audio and/or video signals. A number, R, of filters FILTER_1-R in the bank have respective inputs tied to a common signal source INPUT_SIGNAL. Each of the filters in the bank produces its own version of the filtered output, OUTPUT_SIGNAL_1-R, based on the inherent filtering characteristics assigned and built thereinto. Each of the filtered output signals has a frequency band that is narrower than that of the original input signal. In general, the frequency bands of the filtered signals OUTPUT_SIGNAL_1-R are non-overlapping, or slightly overlap each other.

Based on differences in filtering characteristics, digital filters may be generally categorized as finite impulse response (FIR) or infinite impulse response (IIR) filters. The theory of operation and characteristics of these digital filters are well known in the art, information regarding which may be found in many text books covering filters and will not be elaborated here except for a brief examination of a drawing to show the principle of the invention. For this purpose, FIG. 2 shows a network diagram of a digital filter having FIR characteristics, and FIG. 3 shows a network diagram of a digital filter having direct form I IIR characteristics, while FIG. 4 shows a network having direct form II IIR characteristics.

As shown in FIGS. 2, 3, and 4, considering a digital filter device, either with the FIR characteristics of FIG. 2 or IIR characteristics of FIG. 3 or 4, having an external input signal represented by X(n) at a time n provided to the input, a filtered signal Y(n) will be generated at the output. In the examples of the IIR digital filters of both FIGS. 3 and 4, a pole signal W(n) is used to signify an intermediate value of the input signal X(n). This is convenient for the mathematical characterization of the filters to be shown in expressions below that utilize a time series to express the filter output Y(n) signal as a function of the input signal X(n).

In the drawings of FIGS. 2, 3, and 4, in which each of the filters is modeled as a network of characterized nodes, let $h_0$-$h_M$, $a_1$-$a_{N-1}$, $b_1$-$b_{N-1}$, and $c_0$-$c_{N-1}$ represent filter characteristic coefficients for the described filter at time n=0, 1, 2, ..., N-2, and N-1, respectively. In either FIR or IIR filters, a set of expressions express the filter output signal Y(n) at time n as the function of the input signal X(n). Specifically, for the described direct form I IIR digital filter of FIG. 3:

$$W(n)=b_0 \times X(n)+b_1 \times X(n-1)+b_2 \times X(n-2)+ \ldots +b_{N-1} \times X(n-(N-1)), \quad (1)$$

and $$Y(n)=W(n)+a_1 \times Y(n-1)+a_2 \times Y(n-2)+ \ldots +a_{N-1} \times Y(n-(N-1)). \quad (2)$$

Thus, the filter output signal Y(n) at time n may be numerically determined by first evaluating the pole signal value W(n) at the time n in an expression summing a time sequence of products. As shown in the above expression (1) as well as schematically shown in FIG. 3, each of the input signal values X(n-1), X(n-2), ..., X(n-(N-1)) at points in time previous to n is multiplied by a corresponding coefficient $b_0$-$b_{N-1}$ and then summed together to obtain the pole signal value W(n) at that particular time. In turn, the filtered output value Y(n) at the same time n may then be determined using expression (2), which also sums a sequence of products. This mathematical modeling characterizes an IIR digital filter as a series of cascaded network nodes, each delayed in time with respect to previous ones and related by a function $Z^{-1}$, as is schematically designated in the drawing.

The direct form II IIR digital filter of FIG. 4 may be modeled using similar numerical expressions:

$$W(n)=X(n)+a_1 \times W(n-1)+a_2 \times W(n-2)+ \ldots +a_{N-1} \times W(n-(N-1)) \quad (3)$$

and $$Y(n)=c_0 \times W(n)+c_1 \times W(n-1)+c_2 \times W(n-2)+ \ldots +c_{N-1} \times W(n-(N-1)). \quad (4)$$

The simple time-sequential equations (1) and (2) (as well as (3) and (4)) for numerically determining the filtered signal output value of an IIR digital filter, although straight-forward and easily realized when fabricated on a semiconductor device, are often impractical when actually implemented. This is because a number of digital adders, multipliers, and shift registers are required to perform the numerical evaluations set forth in the equations. The quantity of digital components increases linearly as the order of an implemented filter is increased. When a digital filter bank device is designed utilizing these IIR digital filters to process a signal source having multiple sub-sources of music, speech, video, etc., the total number of adder/multiplier/shift register sets increases to a level barely practical for fabrication in any semiconductor integrated circuit device. The reason for this, as mentioned previously, is that digital multipliers require vast amounts of device die surface area to implement. Thus, the dilemma of this implementation is straight-forward: simple in concept, but impractical in application.

SUMMARY OF THE INVENTION

It is therefore an object of the invention to provide a digital filter bank structure and a method of its operation, which employs the principles of both decimation in multi-rate systems and utilizes a distributed arithmetic algorithm, to simplifying the overall digital filter structural configuration by utilizing a time-multiplexed minimum set of filter hardware.

It is another object of the invention to provide a digital filter bank structure and a method of its operation which employs the principle of decimation and uses distributed arithmetic for organizing the digital filter banks of the device such that the structure has a reduced semiconductor device die surface area, allowing practical implementation.

The invention achieves the above-identified objects by providing a digital signal filter bank device for filtering an external input signal, to generate a filtered digital output signal. The digital filter device includes an input signal selector having two inputs, for selecting as output thereof either the input signal or a recursive feedback of one of a number of low-pass filtered signals. A filter bank has an input connected to the output of the input signal selector to receive the output of the input signal selector. The filter bank filters this signal and generates high-pass and low-pass filtered signals by utilizing a distributed arithmetic algorithm and employing a computational procedure involving the summation of product terms. The low-pass filtered signal is fed back to the input selector as one of a number of low-pass filtered signals. The low-pass filtering further employs decimation in the sampling rate for each of the recursive feedback outputs to the input signal selector. The device further includes a frequency band selector having an input connected to the output of the filter bank, for receiving the high-pass filtered signal as an input and for generating the filtered digital output signal of the digital filter bank device.

The invention further achieves the above-identified objects by providing a digital signal filter bank device having a filter bank that include a number of filters organized as one bank of filters. The filters generate filtered outputs having frequency bands that do not overlap or slightly overlap each other.

The invention further achieves the above-identified objects by providing a digital signal filter bank device in which the filters include at least a high-pass filter generating the high-pass filtered signal and a low-pass filter generating the low-pass filtered signal.

The invention further achieves the above-identified objects by providing a digital signal filter bank device in which the filters includes at least a high-pass filter generating the high-pass filtered signal, a low-pass filter generating the low-pass filtered signal, and a number of band-pass filters generating a number of band-pass filtered signals, which are also provided to the frequency band select means.

The invention further achieves the above-identified objects by providing a digital filter bank device in which each of the filters includes a first and a second signal selector, a pole signal processor, a parallel-to-serial converter and transmittor, a shift register, a first memory, a second memory, and a zero signal processor. The first signal selector an input for receiving the selected output of the input signal selector and another input for receiving a first memory data output from the first memory for selective transmission as a first selected signal. The pole signal processor is connected to the first and second signal selectors for receiving the first selected signal and a second selected signal generated by the second signal selector, to generate a pole signal utilizing the distributed arithmetic algorithm to compute a summation of products. The second signal selector has an input connected to the pole signal processor for receiving the pole signal, and another input for receiving the data output of the first memory, for selective generation as the second selected signal, the second selected signal being fed back to the pole signal processor. The parallel-to-serial converter and transmittor is connected to the pole signal processor for receiving the pole signal and converting it from a parallel signal into serial signal for transmission. The shift register is connected to the parallel-to-serial converter and transmitter for receiving the serial signal and for constructing first and second memory addresses utilizing bits of the serial signal data. The first memory then addresses the shift register to retrieve first digital filter characteristic coefficient data stored in memory locations therein, the retrieved first digital filter characteristic coefficient data being generated as the first memory data and provided to the second input of the first signal selector and to the second input of the second signal selector. The second memory then addresses the shift register to retrieve second digital filter characteristic coefficient data stored in memory locations therein, the retrieved second digital filter characteristic coefficient data being generated as second memory data for transmission. The zero signal processor is connected to the second memory for receiving the second memory data, to generate and independently transmit the second memory data as the high-pass and the low-pass filtered signals of the filter bank, utilizing the distributed arithmetic algorithm to compute a summation of products.

The invention further achieves the above-identified objects by providing a method for operating a digital filter bank device for filtering an external input signal to generate a filtered digital output signal. The digital filter bank device includes an input signal selector, a filter bank, and a frequency band selector. The input signal selector has two inputs and selects as an output either the input signal or the recursive feedback of one of a number of low-pass filtered signals. The filter bank has an input connected to the output of the input signal selector and receives the output of the input signal selector filtering, to generate high-pass and low-pass filtered signals by utilizing a distributed arithmetic algorithm to compute a summation of products. The low-pass filtered signal is fed back to the input selector as one of the plurality of low-pass filtered signals. The low-pass filtering process further employs decimation in the sampling rate for each of the recursive feedback signals provided to the input signal selector. The frequency band selector has an input connected to the output of the filter bank for receiving the high-pass filtered signal as an input, and for generating as an output the filtered digital output signal of the device.

The invention further achieves the above-identified objects by providing a method for operating a digital filter bank for filtering an external input signal to generate a filtered digital output signal. The digital filter bank includes an input signal selector, a filter bank, and a frequency band selector. A summation of products calculation is initialized by storing an initial product term in a accumulator means. An input signal is provided to a pole signal processing unit. The pole signal processing unit adds the input signal to the product term stored in the accumulator, to obtain a pole signal. The pole signal processing unit sends the processed signal to a parallel-to-serial conversion and transmission unit and to a second selector. The parallel-to-serial conversion and transmission unit converts and transmits the processed data signal as a sequence of serial bits to a shift register. The shift register addresses a memory location in first and second memories upon receiving each of the corresponding bits of a 0-th-order term of processed data, which is converted and transmitted by the parallel-to-serial conversion and transmission unit. The first and second memories fetch the respective memory contents held in memory locations corresponding to those addressed by the shift register. The 0-th-order term data held by the first memory is fetched to the pole signal processing unit and stored therein. The second memory fetches its addressed 0-th-order term memory content to the zero signal processing unit. The shift register sends its 1st-order term of the pole signal data received from the parallel-to-serial conversion and transmission unit to both the first and second memories. The first and second memories fetch their respective addressed 1st-order term memory contents. The 1st-order term data held by the first memory is fetched to the pole signal processing unit. The pole signal processing unit divides the stored 0-th-order term data a designated number of times and adds it to the 1st-order term data to obtain the new pole signal. The pole signal processing unit fetches the new pole signal to the second selector only. The second memory fetches its 1st-order term data to the zero signal processing unit, which adds it to the 0-th-order term data, which has been divided a designated number of times. The zero signal processing unit completes and generates the filtered signal data. The pole signal processing unit generates a sum of products for the zero signal processing unit to transmit as the device filtered output. The process is repeated until all order terms are complete.

BRIEF DESCRIPTION OF THE DRAWING

Other objects, features, and advantages of the invention will become apparent by way of the following detailed description of the preferred but non-limiting embodiments. The description is made with reference to the accompanied drawings in which.

DETAILED DESCRIPTION OF THE PREFERRED EMBODIMENT

The underlying principle of operation of the digital filter bank device hardware structure of the invention combines two concepts of hardware operating schemes. One concept is "decimation in a multi-rate system," the other is "distributed arithmetic algorithm." Both concepts of hardware operating schemes are implemented in the device hardware in a time-multiplexed manner.

Essentially, a limited, or in other words, minimum number of digital filter constituent logic components are organized in a digital filter bank hardware device that is operated in a frequency-time, hierarchically arranged, recursively fed back scheme of utilization, based on the concept of decimation of a multi- rate-operated system. Such a digital filter bank hardware device is operated in accordance with the summation of products numerical analysis model for generating the filter output signal, and the computations are performed in a software scheme based on the concept of a distributed arithmetic algorithm. The use of this minimum hardware is further enabled through the use of a time-multiplexed scheme for the implementation of both the decimation and the distributed arithmetic principles of signal processing. The use of such a digital filter bank device results in a digital filter hardware architecture that has a semiconductor device die surface area that is significantly reduced relative to that built around the prior art concept.

Decimation is utilized in a system that is operated at different rates in different stages of operation. The decimation is characterized by the repeated use of a limited number of digital filters in a scheme that is hierarchically arranged, is time-multiplexed, and involves recursive feedback. Using those limited number of filters, an input signal is sub-divided into a number of frequency bands based on the characteristics and processing requirements of the incoming signal source. Also, the processing applied to each devised frequency band may be emphasized in accordance with the specific requirements of different algorithms.

The concept of a distributed arithmetic algorithm involves processing a signal to generate a summation products, as required for a filter output signal value determination for the digital filters as described above. This concept is characterized by fast processing using fast memory devices having pre-determined, characteristic coefficients as the contents of a look-up table.

Figure 5:
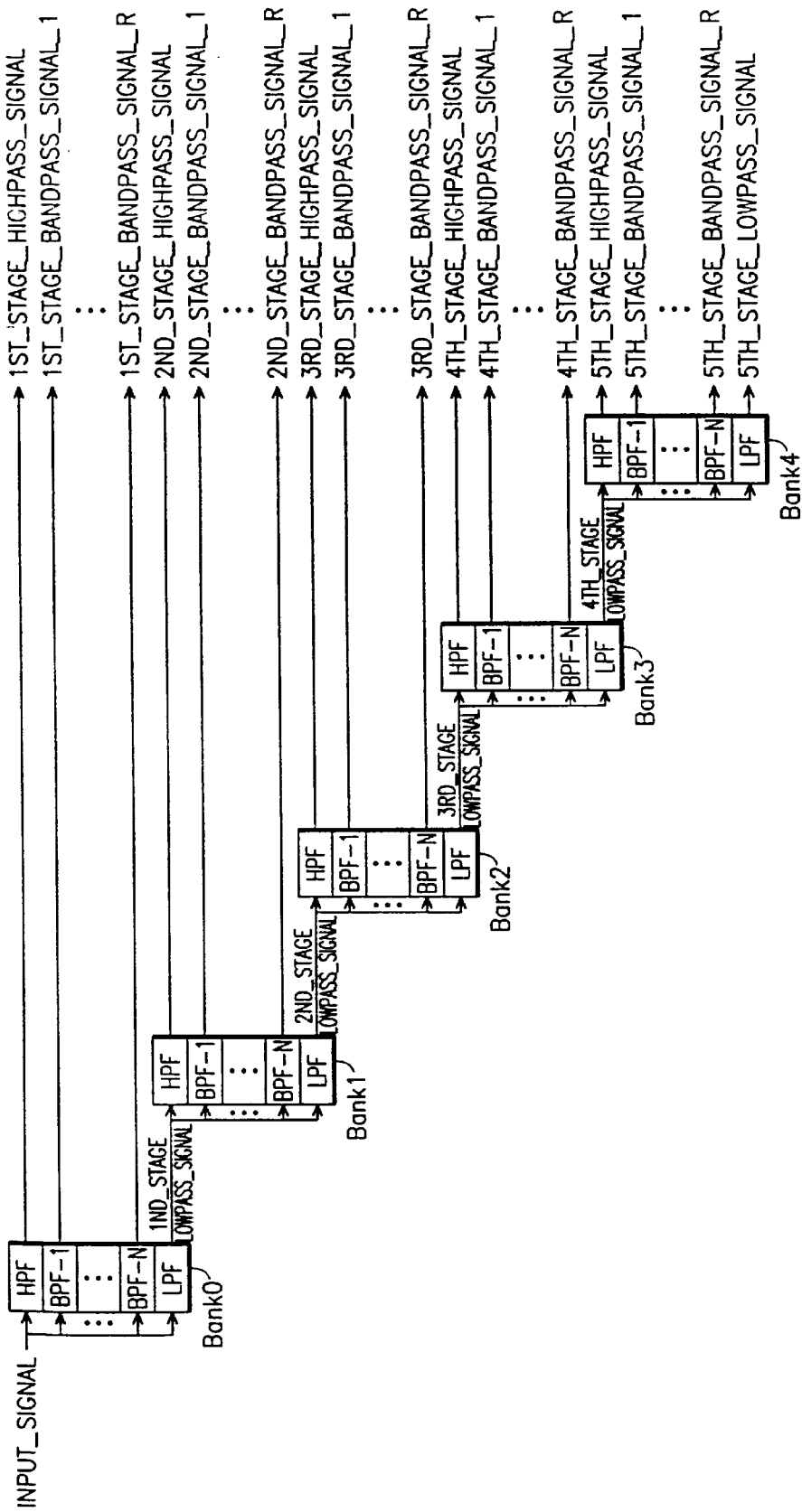
FIG. 5 is a schematic diagram showing the hierarchically-characterized utilization of five digital filter banks employing the principle of decimation, in accordance with a preferred embodiment of the invention.

For a detailed description of the hardware concept of decimation in multi-rated systems, refer to FIG. 5. FIG. 5 schematically shows the hierarchically-characterized time utilization of a number of digital filter banks employing the principle of decimation in accordance with a preferred embodiment of the present invention. As shown in the drawing, decimation with multiple rates of operation is performed by digital filter device hardware architecture using five banks of digital filters BANK0–4, although more of fewer than five banks may be used, as persons skilled in the art will appreciate.

Each of the digital filter banks BANK0–4 may include the same or similar structural configuration, although this is not necessarily so. For the purpose of clarity in the following description, the exemplary hardware configuration, with all five banks having similar structural configuration, is shown in the drawing. Thus, each filter bank includes a high-pass filter HPF, a low-pass filter LPF, and a number N of band-pass filters BPF1-N. The band-pass filters may be omitted for some applications. In other words, the band-pass filters BPF1-N are optional within the scope of the invention.

Essentially, each of the five filter banks BANK0–4 has a high-pass filter HPF providing a high-pass filtered signal, a low-pass filter LPF providing a low-pass filtered signal, and a multiple number of band-pass filters BPF1-N providing respective band-pass filtered signals. All the filter impulse responses within the same bank may have non-overlapping or slightly-overlapping frequency bands of no more than 3 dB cut-off frequency, as can the conventional filter bank devices mentioned above. These five filter banks BANK0–4 may be, in the sense that the input signal is processed, connected in a cascaded manner, as schematically shown in the drawing. It must, however, be pointed out at this stage that there is actually no physical cascade of banks of filters, as the descriptive paragraphs that follow explain. The first bank BANK0 has all the inputs of the high-pass, low-pass, and band-pass filters HPF, LPF, and BPF1-N, tied together and fed by the external input signal INPUT_SIGNAL. Thus, the stages will be referred to as being virtually cascaded. The high-pass and band-pass filters in BANK0 in turn generate filtered signals, which are referred to respectively as the first-stage outputs 1ST_STAGE_HIGHPASS_SIGNAL and 1ST_STAGE_BANDPASS_SIGNAL1-N in the drawing. The output of the low-pass filter of BANK0, 1ST_STAGE_LOWPASS_SIGNAL, serves as the input to all the filters, high-pass, low-pass, and band-pass inclusive, of the second bank of filters BANK1.

In a similar arrangement, the second bank BANK1 has all the inputs of the high-pass, low-pass, and band-pass filters HPF, LPF, and BPF1-N tied together and fed by the 1ST_STAGE_LOWPASS_SIGNAL. The high-pass and band-pass filters in BANK1 generate filtered signals, which are referred to respectively as the second-stage outputs designated as 2ND_STAGE_HIGHPASS_SIGNAL and 2ND_STAGE_BANDPASS_SIGNAL1-N. The output of the low-pass filter of BANK1 in turn serves as the input to all the filters, high-pass, low-pass, and band-pass inclusive, of the third bank of filters BANK2. This virtually cascaded arrangement continues for all five banks of digital filters BANK0–4 as shown in FIG. 5. Thus, the fifth bank BANK4 has an array of filtered output signals 5TH_STAGE_HIGHPASS_SIGNAL, 5TH_STAGE_BANDPASS_SIGNAL1-N, as well as 5TH_STAGE_LOWPASS_SIGNAL.

At the outputs of each of the first four of the five banks of filters BANK0–3, namely, at each of the first, second, third, and fourth stages, each of the filtered outputs of the respective low-pass filters LPF, specifically 1ST_, 2ND_, 3RD_, and 4TH_STAGE_LOWPASS_SIGNAL, is "decimated" in terms of time-frequency before being provided to the inputs of the filters in the next cascaded bank. By definition, an M-fold decimation refers to a sampling rate scaling down by 1/M, wherein every M-th sampled output (i.e., filtered output) of the selected filter, the low-pass filters LPF in the first four banks BANK0–3 for example, is selected to be provided as the input to the next bank of filters.

Thus, in a filter bank device similar to the one depicted in FIG. 5, having a virtual hierarchically-cascaded configuration with Q stages of filter banks, an M-fold decimation in each of the bank stages will result in a proportionally reduced rate of operation in each of the subsequent filter bank stages. This is known as a multi-rated system, as stages in the filter bank device sample input signals at different rates. Specifically, the first stage of filter banks in a device provide an input signal to the next cascaded (second) stage at an operating sampling frequency that is M times the frequency the second is feeding the third. In this manner, the fifth stage of filter banks in the device exemplified in FIG. 5 will have an input signal that is sampled at $1/M^1$ the rate that the original signal is sampled at the first stage. This situation is better shown in FIG. 6, which is a timing diagram showing the timing sequence of the filter-enabling control signals L[1], L[2], . . . , and L[5] of the five-stage digital filter banks outlined in FIG. 5, employing the principle of decimation.

Figure 6:
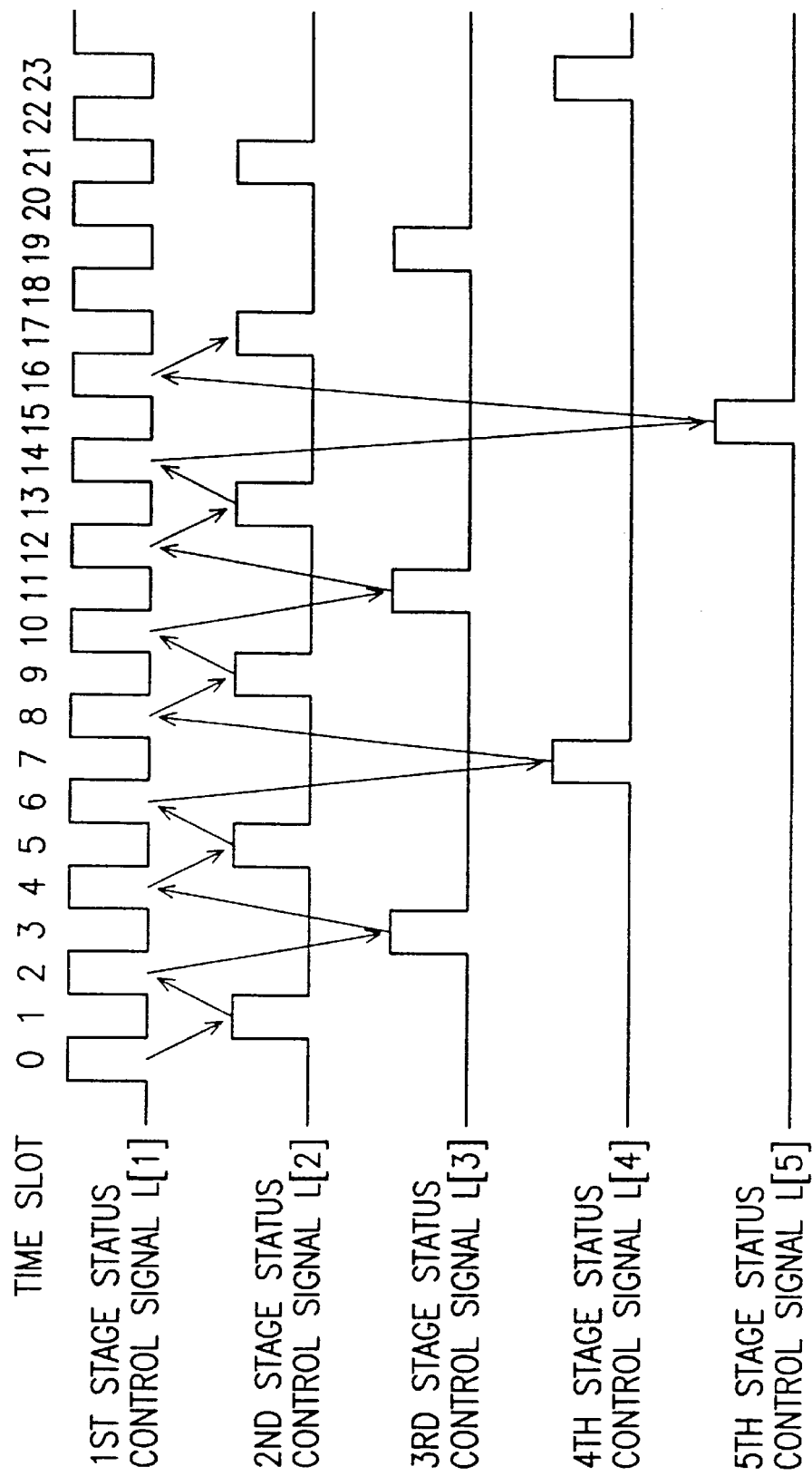
FIG. 6 is a timing diagram showing the timing sequence of the filter-enabling control signals for the five-stages of digital filter banks of FIG. 5, employing the principle of decimation, in accordance with a preferred embodiment of the invention.

In the filter-enabling control signal sequence for the device of FIG. 5 shown in FIG. 6, assume positive logic for the filter operation enable signal. In other words, the filtering operation in a stage of filter banks is enabled only when the corresponding filter-enabling control signal L[1:5] of the five-stage digital filter bank configuration of FIG. 5 is a positive pulse. As persons skilled in the art appreciate, the five filter enable control signals L[1:5] outlined in FIG. 6 for the five-stage device of FIG. 5 may be easily implemented utilizing, for example, standard off-the-shelf discrete logic components.

In the timing diagram example of FIG. 6, also assume a two-fold (M=2) decimation. The basic timing unit of the entire filter device is provided by the time slot units in the first stage of the filter banks. A total of 24 basic timing units is shown for a description of this two-fold decimation scheme. It is also assumed that the controlling signals are falling edge-triggered. Specifically, at the falling edge of the control signal L[1] is basic time slot 0, the first active period of the control signal L[2] for stage 2 of the filter banks is triggered. This first control signal of L[2] is sustained for the entire duration of basic time slot 1. After this first control signal for L[2] is deasserted when time slot 1 expires, the second active period of the control signal L[1] arises again, in the third basic time slot 2.

In this manner, the filter-enable control signal for stage 2 of the filter banks of the device shown in FIG. 5 will assume a sampling rate of one effective filter-enabling pulse per four basic time slots, a two-fold sampling rate decrease with respect to that of stage 1. Similarly, the filter-enable control signal for stage 3 of filter banks assumes a sampling rate of one effective enabling pulse per eight basic time slots, or one enabling pulse per two enabling pulses in stage 2, a further two-fold decrease in sampling rate. Thus, the filter-enabling control signal sequence for the fifth stage of filter banks in the device of FIG. 5 will be one effective pulse per 32 basic time slots.

One important characteristic of this filter-enabling scheme for the total of five stages of filter banks in the device of FIG. 5 should be emphasized. Note from the depicted control timing diagram of FIG. 6 that there are no two filter enabling control signals issued simultaneously during any time slot. This relates to the above indication that no substantial physical cascade of filters banks is necessary to implement the digital filter device of the invention.

This timing of control signals is of particular importance to the invention, as it allows for the utilization of only one, rather than five, banks of high-pass, low-pass, and band-pass filters to perform the entire digital filtering operation on the incoming signal INPUT_SIGNAL, in a scheme outlined in the control sequence diagram of FIG. 6, in the manner of the configuration of FIG. 5. In other words, since, as mentioned above, each of the filter-enabling control signals L[1], L[2], . . . , L[5] for the disclosed five stages of digital filter banks shown in FIG. 5 is active independently (on the time axis), only one of the five banks of filters (BANK0 for example) is required, if used repeatedly, to function as an equivalent to the first, second, third, fourth, and fifth stages, of the filter bank of FIG. 5. The time-multiplexed utilization of a single bank of high-pass, low-pass, and band-pass filters is characteristic of the concept of decimation in multi-rate systems. Altogether, there are five different sampling rates used in the operation of the system as depicted in FIGS. 5 and 6. However, as persons skilled in the art will appreciate, more or fewer than five banks, or five repeated utilizations of a single bank, of high-pass, low-pass, and band-pass filters can be utilized in the signal processing procedure, depending on the system design requirements.

Referring again to the schematically shown hierarchical configuration of FIG. 5, an incoming external signal INPUT_SIGNAL, to be processed by the filter bank device, is provided to the combined inputs of all the high-pass, band-pass, and low-pass filters in the first stage, (filter bank BANK0) during the entire time sequence of all the outlined basic time slot units shown in FIG. 6. There is, however, only one stage of filter banks in the entire device shown in FIG. 5 that is enabled at any given time to process the correspondingly selected portion of the frequency band of the original input signal, as indicated above. Thus, there is no situation which would call for two filter-enabling control signals in the entire device to be issued simultaneously. This allows for the repeated time-multiplexed utilization, as mentioned above, of the single set of filter bank hardware in performing the digital signal processing necessary for implementing the inventive digital filtering scheme. Further, this scheme also conforms to the general requirement that higher frequency portions of the original signal be sampled at a higher sampling rate, while the lower frequency portions are sampled at a lower sampling rate, for successful filtering operation.

Figure 7:
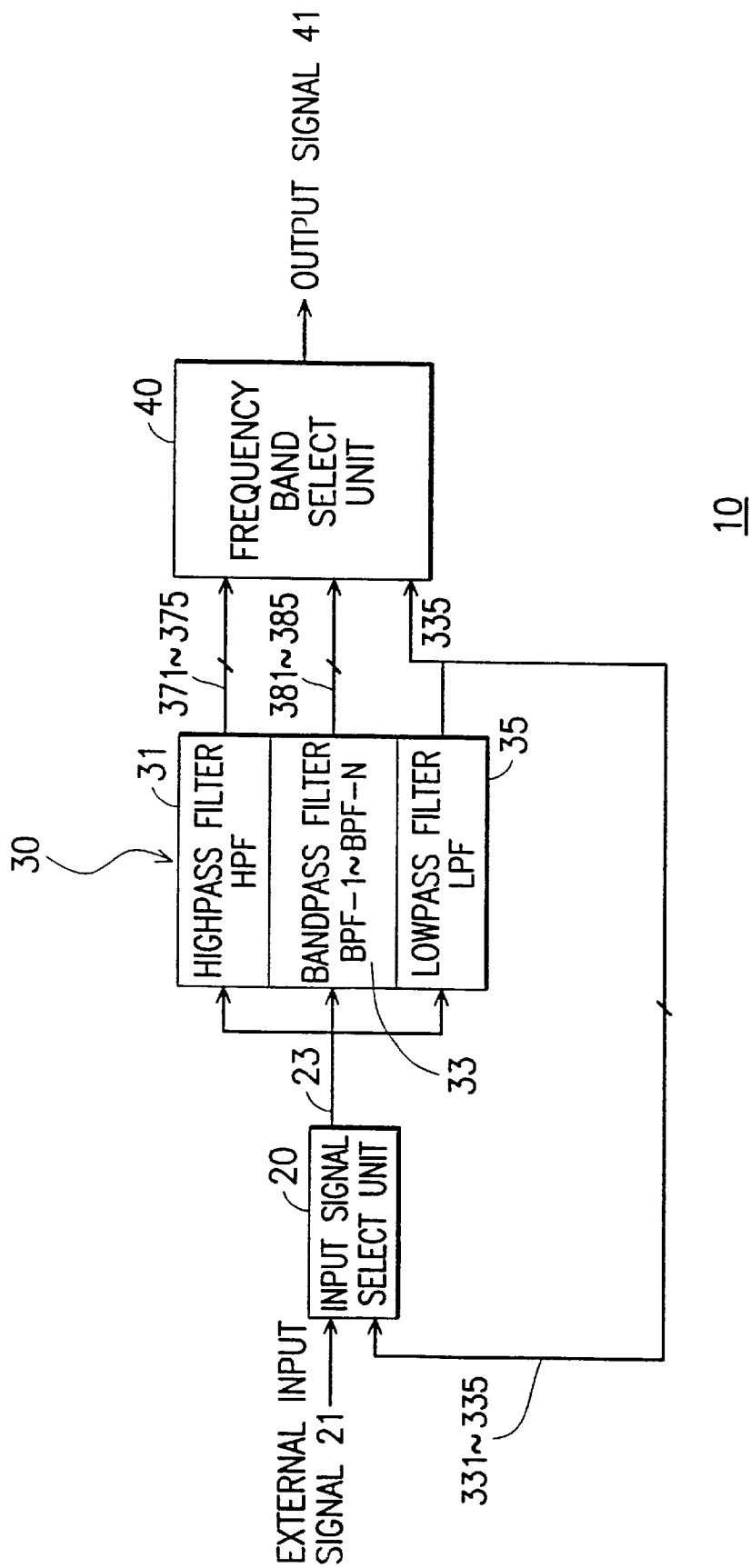
FIG. 7 is a block diagram schematically showing the hardware configuration of a digital filter bank device employing a recursive feedback scheme, in accordance with a preferred embodiment of the invention.

A preferred embodiment of the digital filtering device in accordance with the invention is described below to show how the hierarchically-arranged configuration of FIG. 5 may be substantially implemented in a digital filter device. For this purpose, reference is made to FIG. 7. FIG. 7 is a block diagram schematically showing the hardware configuration of a digital filter bank device employing a recursive feedback scheme in accordance with a preferred embodiment of the invention. As shown in the drawing, the inventive digital filter bank device generally identified by reference numeral 10, has a hardware architecture that includes an input signal select unit 20, a filter bank unit 30, and a frequency band select unit 40. Essentially, the filter bank unit 30 has a hardware structure that is functionally equivalent to any of the five combined filter banks BANK0–4 shown in FIG. 5, assuming a device employing the five-stage decimation described above in relation to FIGS. 5 and 6 is again utilized as an example.

At the input end of the input signal select unit 20, the external input signal 21, together with all of the five low-pass filter outputs of the respective five equivalent stages of the filter banks BANK0–4 (designated as labels 1ST_, 2ND_, 3RD_, 4TH_ and 5TH_STAGE_LOWPASS_ SIGNAL in FIG. 5 but as respective reference numerals 331–335 in FIG. 7) are provided for selection by the input signal select unit 20. Only one of these six signals is selected at any time for sampling and provision to the next connected component, the filter bank unit 30. As an original signal to be processed by the inventive device, the external input signal 21 may be an analog signal suitably sampled and converted into a digital format. Further, as described below, each of the five low-pass filter outputs 331–335 provided to the input signal select unit 20 has been properly decimated in the filter banks unit 30 in its respective recursive feedback decimation cycle before being routed back to the input signal select unit 20.

The filter bank unit 30, as in the case of the the system shown in FIGS. 5 and 6, may include a virtual array of a number of (five in this example) filter banks that physically is only one bank utilized in a time-multiplexed scheme. Each of the virtual banks, or, the single actual bank, includes at least a high-pass filter 31 (HPF in FIG. 5) and at least a low-pass filter 35 (LFP), plus a number of optional band-pass filters 33 (BPF1-R). Since band-pass filters 33 are optional, it is contemplated that none of them may be included in the filter bank unit 30, but at least a pair of high-pass and low-pass filters 31 and 33 must be included for reasonable device operation.

The result of the selection from among the external input 21 and the routed-back low-pass filter outputs 331–335 by the input signal select unit 20, i.e., the filter input signal 23, is provided to the inputs of all the filters in the first stage of the filter bank unit 30, as described previously. A filter-enabling control signal assertion scheme, such as the one that includes control signals L[1:5] described in relation to FIG. 6, is then applied to the corresponding filters in all five banks of the filter bank unit 30.

The application of this filter-enabling scheme over the filter bank unit 30 results in a set of filtered output signals, some of which are subsequently provided to the frequency band select unit 40, while others are recursively routed back to the input signal select unit 20. Essentially, as described previously, the outputs of all the high-pass and band-pass filters, signals 371–375 and signals 381–385 (respectively corresponding to 1ST_–5TH_STAGE_HIGHPASS_SIGNAL and 1ST_STAGE_BANDPASS_SIGNAL1-R of the five stages of the device of FIG. 5), respectively, in the filter bank unit 30, are independently provided to the input of the frequency band select unit 40 as determined by the enabling scheme shown in FIG. 6. Likewise, the outputs of all the low-pass filters, or signals 331–335 (respectively corresponding to 1ST_–5TH_STAGE_LOWPASS_SIGNAL of the device of FIG. 5) in the filter bank unit 30 are recursively fed back to the input signal select unit 20 based on the same enabling scheme.

At the frequency band select unit 40, one of the high-pass and the optional band-pass filtered signals 371–375 and 381–385, respectively, as well as the low-pass filtered signal 335 of the low-pass filter in the last stage of the virtual filter bank in the filter bank unit 30, is selectively chosen for generation as the device filtered output signal 41.

Assuming that a two-fold decimation is again employed for operation of the filter bank unit 30 shown in FIG. 7, at the very beginning of the filtering operation, the input signal select unit 30 first selects the external input signal 21 as the filter input signal 23, and provides it to the filter bank unit 30. During this first stage, the low-pass filter 35 in the filter bank unit 30 generates a low-pass filtered signal 331 for feedback to the input signal select unit 20. This first stage feedback low-pass signal 331, upon reception at the input signal select unit 20, is available for selection as the filter input signal 23 during the second stage of operation of the filter bank unit 30. The selection of low-pass filtered signal 331 will occur as part of the filter-enabling scheme once every two of its occurrences (every four time slots), since the example assumes a two-fold decimation. In a similar manner, the second stage low-pass filtered signal 332 will be selected as part of the filter-enabling scheme once every two of its occurrences (every eight time slots) at the input of the input signal select unit 20, as the filter input signal 23 provided to all the filters during the third stage of operation of the filter bank unit 30. Likewise, the fifth stage low-pass filtered signal 335 will be selected in a scheme once every two of its occurrences at the input signal select unit 20, for provision to all the filters during the fifth stage of operation of the filter bank unit 30.

At the frequency band select unit 40, as described above, the high-pass and optional band-pass filtered signals 371–375 and 381–385, respectively, as well as the low-pass filtered signal 335 of the last stage low-pass filter, are provided for selection as the device filtered output signal 41. The selection decision for the final device output signal is also based on the filter-enabling scheme. The correspondence of the output signal selection in the frequency band select unit 40 of the digital filter bank device 10 with the filter-enabling control signal issuing scheme of FIG. 6 is described below, showing the detailed operational steps made with respect to the basic time slot units.

As shown in FIG. 6, during basic time slot 0, L[1]=1, which signifies that the digital filter bank device 10 is in the first stage of filtering operation, referred to herein as being in the first stage status. In this status, the input signal select unit 20 selects the external input signal 21 to provide to the filter bank unit 30. Since the filter bank unit 30 is in first stage status, it thus generates a first-stage high-pass filtered signal 371, a set of optional first-stage band-pass filtered signals 381 (381_1-R, assuming a total of R band-pass filters are present), as well as a first-stage low-pass filtered signal 331. These output signals remain asserted until the next time slot for the first stage, basic time slot 2.

During basic time slot 1, L[2]=1 signifies that the digital filter bank device 10 is in second stage status. In this status, the input signal select unit 20 selects the feedback first-stage low-pass filtered signal 331 to provide to the filter bank unit 30. Since the filter bank unit 30 is in second stage status, it thus generates a second-stage high-pass filtered signal 372, a set of optional second-stage band-pass filtered signals 382 (382_1-R, assuming again a total of R band-pass filters are present), as well as a second-stage low-pass filtered signal 332. These output signals again remain asserted until the next time slot for the second stage, basic time slot 5.

Then, during basic time slot 2, again L[1]=1, which signifies that the digital filter bank device 10 is in first stage status. In this status, the input signal select unit 20 selects the external input signal 21 again to provide to the filter bank unit 30. Since first stage status is again established, the filter bank unit 30 generates the first-stage high-pass filtered signal 371, the set of optional first-stage band-pass filtered signals 381 (381_1-R, assuming a total of R band-pass filters are present), as well as the first-stage low-pass filtered signal 331, again. These output signals again remain asserted until the next basic time slot for the first stage, basic time slot 4.

Based on the same timing, the digital filter bank device 10 is driven to operate upon the external input signal 21 in accordance with the filter controlling scheme shown in FIG. 6 for generating the filtered output signal 41. Recall the fact that no two filtering stages are simultaneously valid, and therefore the filter banks are time-multiplexed at a number of sampling rates, utilizing a single bank of filters.

The following paragraphs detail the design of the basic input signal select unit 20, filter bank unit 30, and frequency band select unit 40, which together form the digital filter bank device 10. In the following examples, assume a digital filter bank device 10 having a five-stage configuration operating number a two-fold decimation sampling scheme.

Figure 9:
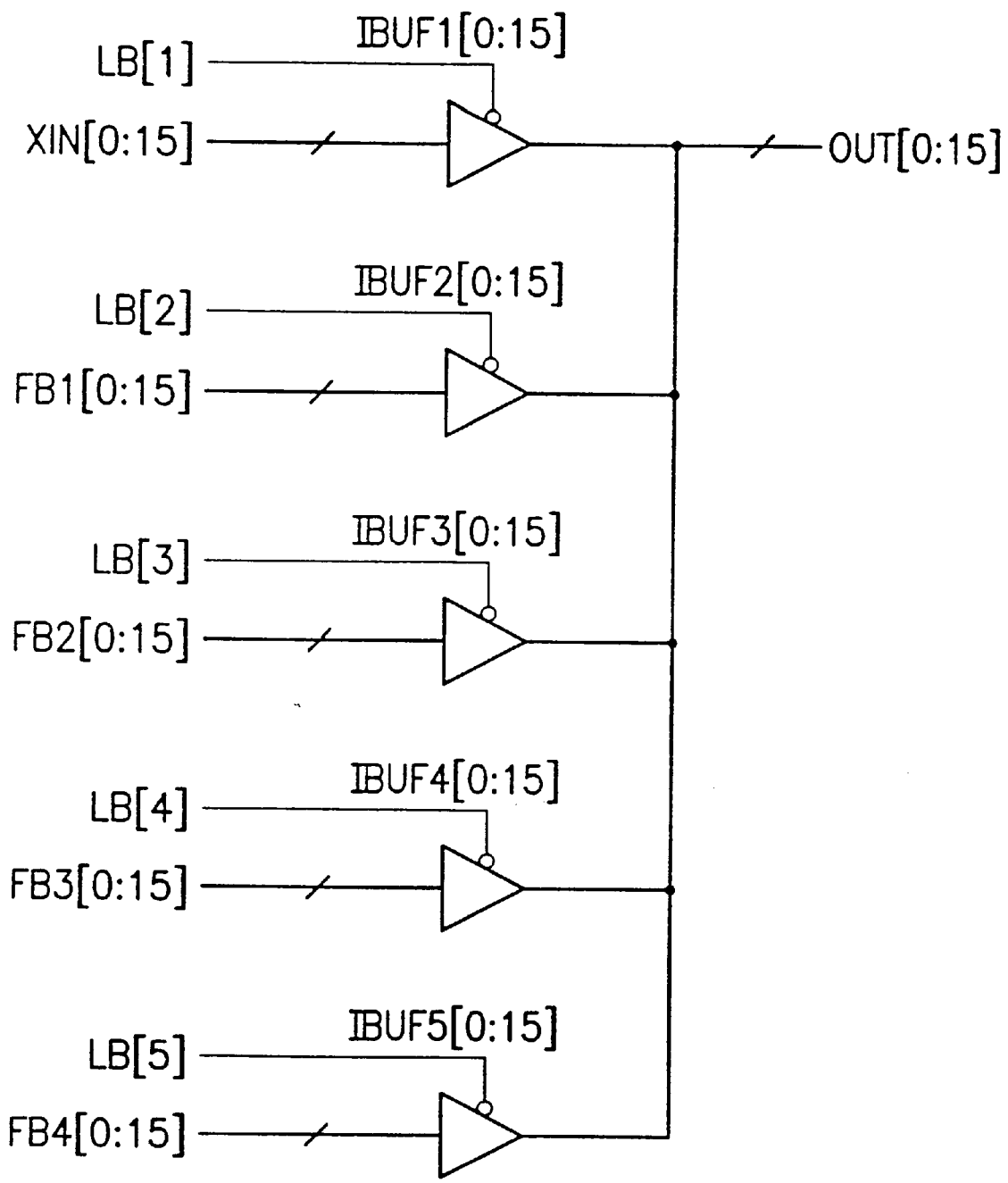
FIG. 9 is a schematic diagram of an input signal select unit, in accordance with a preferred embodiment of the invention.

FIG. 9 is a simplified schematic diagram of an input signal select unit 20 in accordance with a preferred embodiment of the invention. As indicated above, assuming again a five-stage filter-bank device 10, the input signal select unit 20 is shown to generally include an array 90 of tri-state buffers.

It should be noted that, under normal circumstances, practical filter devices such as the filter-bank device 10 embodied herein will be processing digital sound and/or video signals having a resolution of more than several bits. For example, conventional digital music signals handled in audio equipment such as audio compact disk players, normally have a resolution of 14 to 16 bits. In the example of FIG. 9, a signal resolution of 16 bits is used, signified by the destination of the input signal as XIN[0:15].

Therefore, the array 90 of tri-state buffers includes five sets of buffer devices generally designated as IBUF1[0:15], IBUF2[0:15], IBUF3[0:15], IBUF4[0:15], and IBUF5 [0:15]. Each of the five sets of buffers includes a total of 16 tri-state buffers, which is clear from the reference designations although these are not individually shown in the drawing. For example, the set of tri-state buffers IBUF1_ 0–15 includes buffer devices IBUF1[0}, IBUF1[1], . . . , and IBUF1[15].

Thus, the input end of the input signal select unit 20 is fed by the digital external input signal XIN[0:15], which has a data width, or resolution, of 16 bits, as well as by four other recursive feedback low-pass filtered, 16-bit-wide signals FB1[0:15], FB2[0:15], FB3[0:15] and FB4[0:15]. Specifically, each of the 16 data bits of the external input signal XIN[0:15] is provided to the corresponding input line of the first set of tri-state buffers IBF1[0:15]. Each of the 16 low-pass filtered signal bits FB1[0:15] fed back from the first stage filter bankouput of the filter bank unit 30 is provided to the corresponding input line of the second set of tri-state buffers IBUF2[0:15], and each of the 16 low-pass filtered signal bits FB4[0:15] fed back from the fourth stage filter banks ouput of the filter bank unit 30 is provided to the corresponding input line of the fifth set of tri-state buffers IBUF5[0:15], etc.

In FIG. 9, an inverted version of the filter-enabling control signal, LB[1:5], is shown generated and provided to the buffer control input pins of the five sets of tri-state buffers in the array 90. The inversion is necessary, as the tri-state buffers in the array 90 are shown to have active-low output enable control inputs. As persons skilled in the art will appreciate, the original, i.e., the non-inverted, version of L[1:5], such as that described in relation to FIG. 6, can be used to directly control the output enable inputs of the tri-state buffers, provided another compatible version of tri-state buffer is used in the array 90.

Particular attention should again be paid to the fact that the outputs of the five sets of tri-state buffers IBUF1[0:15], IBUF2[0:15], IBUF3[0:15], IBUF4[0:15], and IBUF5[0:15] are tied together in wired-OR fashion. Specifically, the outputs of tri-state buffers IBUF1[0], IBUF2[0], IBUF3[0], IBUF4[0] and IBUF5[0] are tied together, the outputs of tri-state buffers IBUF1[1], IBUF2[1], IBUF3[1], IBUF4[1] and IBUF51] are tied together, and so on. A total of 16 lines, each including five tied outputs, are formed to constitute the output signal, OUT[0:15], having a data width of 16 bits. It is possible to tie these outputs together because the buffers in the array 90 are tri-state in nature, and only one of the five sets of buffers in the array 90 is designed to be activated by the control signals LB[1:5] at any one time.

When LB[1]=0 and LB[2:5]=1, the result obtained at the output OUT[0:15] of the input signal select unit 20 is:

OUT[0:15]=XIN[0:15].

Similarly, when LB[2]=0, LB[1]=1 and LB[3:5]=1, the result obtained at the output OUT[0:15] of the input signal select unit 20 is:

OUT[0:15]=FB1[0:15].

Based on the same reasoning, thus, the filter-enabling control signals L[1:5], or, specifically, the inverted versions LB[1:5], may be employed for the hierarchically-characterized and time-multiplexed control of the filter banks by properly assigning the filter input signal to be processed through operation of the input signal select unit 20. Either the original input signal data word XIN[0:15] or any of the low-pass filtered signal words FB1[0:15]–FB4 [0:15] fed back by the corresponding stage of the filter bank may be selected and sent to the filter bank unit 30 connected thereto for the required filter processing.

In the above-described design of the input signal select unit 20, a two-fold decimation scheme is assumed for the low-pass filter sampling operation, as indicated previously. In the embodiment of the inventive digital filter bank device 10 depicted in FIG. 7, either the original input signal data word XIN[0:15] or any of the low-pass filtered signal words FB1[0:15]–FB4[0:15] fed back by the corresponding stage of the filter bank may thus be selected by the input signal select unit 20 as the input to the filter bank unit 30 for subsequent filter processing. Through the recursive flow of low-pass-filtered feedback signals, any low-pass filtered signal would be selected for subsequent filter processing only once every two occurrences at the input of the input signal select unit 20, recalling that a two-fold decimation scheme is used.

Figure 10:
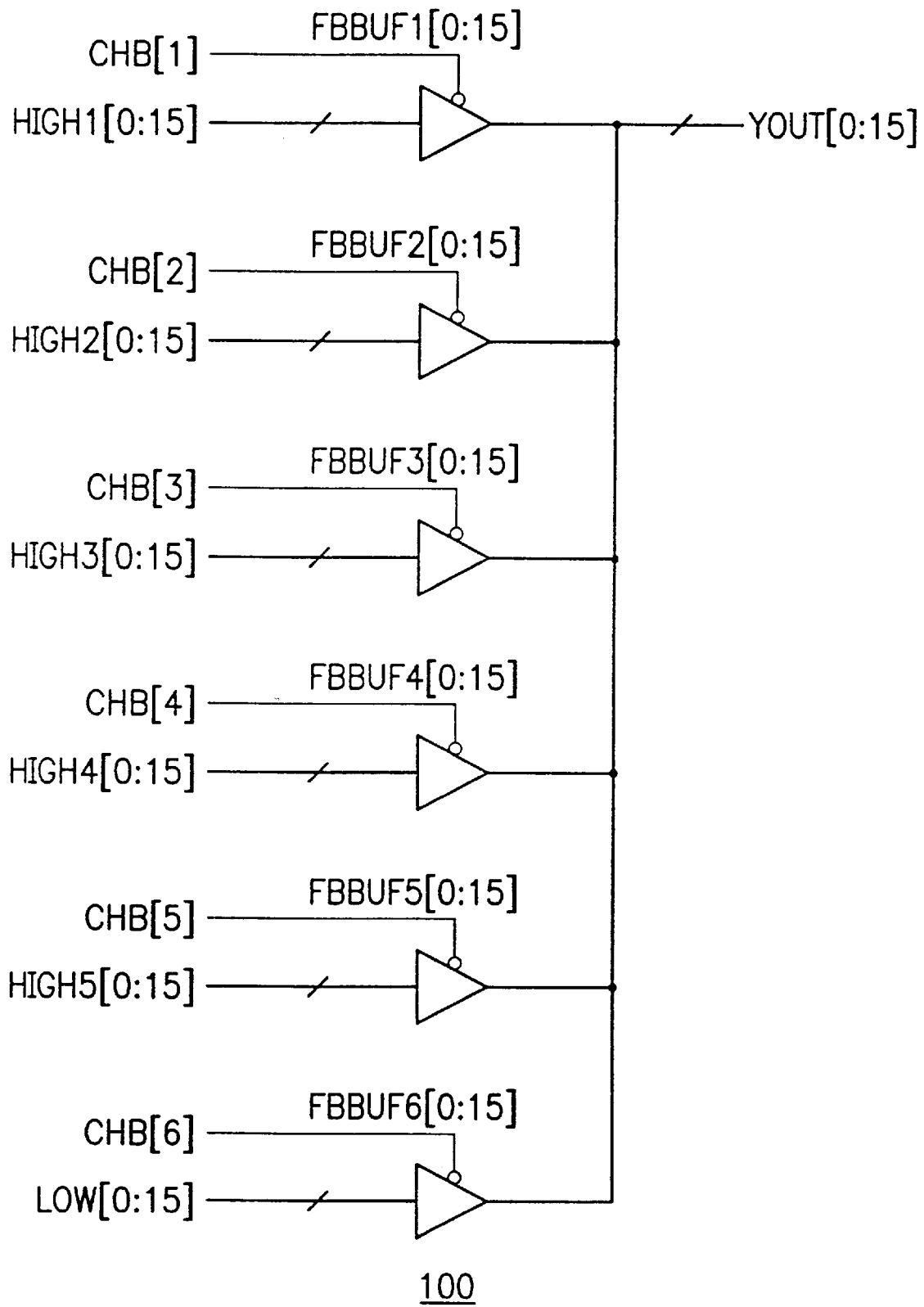
FIG. 10 is a schematic diagram of a frequency band select unit, in accordance with a preferred embodiment of the invention.

The frequency band select unit 40 used in the inventive digital filter bank device 10 shown in FIG. 7 is now examined. FIG. 10 is a simplified schematic diagram of the frequency band select unit 40, in accordance with a preferred embodiment of the invention. In the description of the frequency band select unit 40, it is still assumed that the digital filter bank device 10 hosts five stages of filter banks that are operated under a two-fold decimation scheme. As shown in the drawing, the frequency band select unit 40 is shown to generally include an array 100 of tri-state buffers.

Particular attention is again to be paid to the fact that the constituent components of the filter bank device 10, the input signal select unit 20, the frequency band select unit 40, and the filter bank unit 30, may be processing a sound and/or video digital data signal having a resolution of several bits. In the example of FIG. 10, a signal resolution of 16 bits is again used, as signified by the use of the designation YOUT[0:15], for the output of the filter bank device 10.

The array 100 of the multiple number of tri-state buffers includes six sets of buffer devices generally designated as FBBUF1[0:15], FBBUF2[0:15], FBBUF3[0:15], FBBUF4 [0:15], FBBUF5[0:15] and FBBUF6[0:15]. Each of the six sets of buffer devices includes a total of 16 tri-state buffers, again not individually but, rather, collectively shown in the drawing. For example, the set of tri-state buffers FBBUF1_ 0–15 includes buffer devices FBBUF1[0], FBBUF1[1], . . . , and FBBUF1[15].

Thus, the input end of the frequency band select unit 40 is fed by the outputs of the filter bank unit 30, as shown in FIG. 7. In FIG. 7, the filter bank unit 30 is seen to provide the high-pass and the optional band-pass filtered signals 371–375 and 381–385 respectively. However, recall that another set of signals, are provided to the input of the frequency band select unit 40. They are the low-pass filtered signals of the last (fifth) stage of filter banks in the filter bank unit 30. Note that the high-pass filtered signals 371–375 of FIG. 7, which are also digital signals each having a resolution of 16 bits, are now designated as HIGH1[0:15], HIGH2 [0:15], . . . , and HIGH5[0:15] respectively in the embodiment of FIG. 10.

Also note that, for the sake of clarity in the description of the frequency band select unit 40, the band-pass filtered signals 381–385 shown in FIG. 7 are not included in FIG. 10. This is allowable, recalling that the use of band-pass filters in the filter bank of the device 10 is optional. On the other hand, low-pass filtered output signals of the last (fifth) stage in the filter bank unit 30 having a resolution of 16 bits are provided to this frequency band select unit 40 with a designation of LOW[0:15].

Specifically, each of the 16 high-pass filtered signal bits HIGH1[0:15] generated by the first stage of filter banks in the filter banks unit 30 is provided to the corresponding line of the first set of tri-state buffers FBBUF1[0:15], each of the 16 high-pass filtered signal HIGH2[0:15] generated by the second stage of filter banks in the filter banks unit 30 is provided to the corresponding line of the second set of tri-state buffers FBBUF5[0:15], etc. Similarily, each of the 16 low-pass filtered signal bits LOW[0:15] generated by the last (fifth) stage of filter banks in the filter bank unit 30 is fed to the corresponding line in the sixth set of tri-state buffers FBBUF6[0:15].

In FIG. 10, an inverted and expanded version of the filter-enabling control signal, CHB[1:6] is shown generated and provided to the buffer control input pins of the six sets of tri-state buffers in the array 100. Again, the inversion is necessary, as the tri-state buffers in the array 100 are shown to have active-low output enable control inputs.

It is necessary to address the fact that the output of each of the six sets of tri-state buffers FBBUF1[0:15], FBBUF2[0:15], FBBUF3[0:15], FBBUF4[0:15], FBBUB5[0:15] and FBBUF6[0:15] are tied together in wired-OR fashion. Specifically, the outputs of tri-state buffers FBBUF1[0], FBBUF2[0], FBBUF3[0], FBBUF4[0], FBBUF5[0] and FBBUF6[0] are tied together, the outputs of tri-state buffers FBBUF1[1], FBBUF2[1], FBBUF3[1], FBBUF4[1], FBBUF5[1] and LOW[1] are tied together, and so on. A total of 16 lines, each including five ited outputs, are formed to constitute the output signal, YOUT[0:15], of the frequency band select unit 40, having a data width of 16 bits. Again, it is possible to tie these outputs together because the buffers in the array 100 are all tri-state in nature, and only one of the six sets of buffers in the array 100 is designed to be activated by the control signals CHB[1:6] at any one time.

Essentially, when CHB[1]=0 and CHB[2:6]=1, the result obtained at the output YOUT[0:15] of the frequency band select unit 40 is:

YOUT[0:15]=HIGH1[0:15].

Similarly, when CHB[2]=0, CHB[1]=1 and CHB[3:6]=1, the result obtained at the output YOUT[0:15] of the frequency band select unit 40 is

YOUT[0:15]=HIGH2[0:15].

Thus, the buffer output enable control signals CHB[1:6] may be employed for the hierarchically-characterized and time-multiplexed control of the filter banks by properly assigning the filtered signals to be processed through the operation of the frequency band select unit 40. Either the low-pass filtered version of the signal output of the last stage of the filter bank unit 30, or any of the high-pass filtered signal words HIGH1[0:15]–HIGH5[0:15] generated by the corresponding stage of the filter bank unit 30, may be selected and generated as the output of the inventive digital filter bank device 10 shown in FIG. 7.

Before proceeding to describe the details of a hardware configuration of a filter bank unit 30, an introduction to the distributed arithmetic algorithm that forms the conceptual basis of another phase of the digital filter device of this invention requires certain elaboration.

The principal differences among digital high-pass filters (HPF), low-pass filters (LPF), and band-pass filters (BPF) employed as the basic building blocks for the filter block device of the invention are the coefficients and the product terms employed in the expression of the characteristic equation obtained in expression (5) shown below. Before this characteristic equation for digital filters is described in detail, several variables must be defined.

Assume time, represented by the variable n, is the independent variable for determining a filtered output based on processing of an input data signal, which is also a function of time n. A total of N basic time slots are used for the following analysis. In the expression, $\{c_j\}$ is utilized to designate a set of digital filter coefficients, wherein j=0, 1, 2, ..., and N−1 is another variable used to count through the coefficients in the analysis, corresponding to the time variable n. In the process of analyzing filter operation, since it is assumed that time n is measured in terms of basic time slot units n=0, 1, ..., and N, Y(n) may be used to represent the filtered output signal at the current time. On the other hand, $\{W(n-j)\}$ represents the sequence of pole signals at a previous time (n−j). Therefore, when j=0, $\{W(n)\}$ represents a pole signal at the current time.

Based on the above definitions, the filtered output of a digital filter bank device expressed as the function of a time variable may be given as:

$$Y(n)=c_0 \times W(n)+c_1 \times W(n-1)+c_2 \times W(n-2)+ \ldots +c_{N-1} \times W(n-(N-1)) \quad (5)$$

Figure 1:
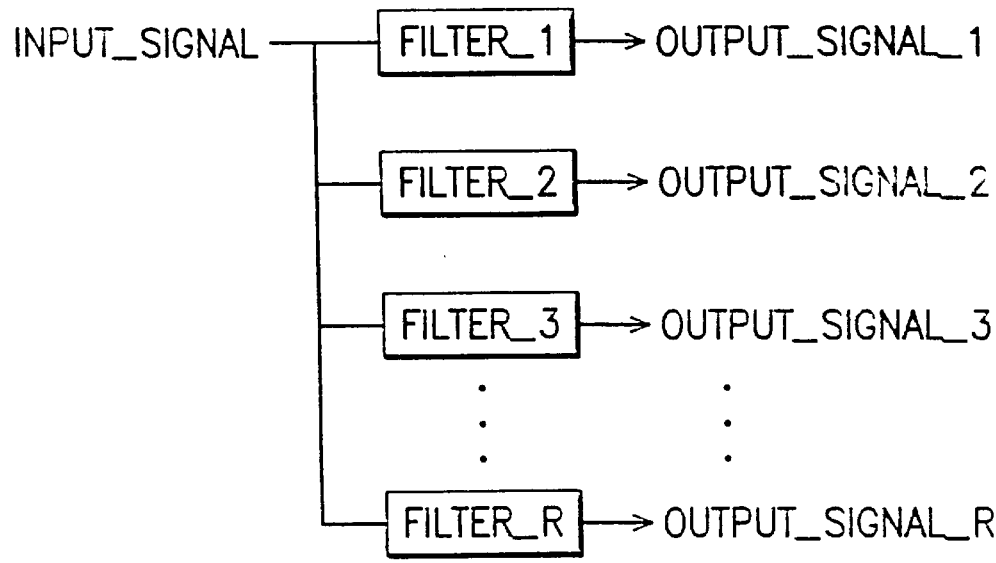
FIG. 1 shows a block diagram of a conventional filter bank used for signal processing.
Figure 2:
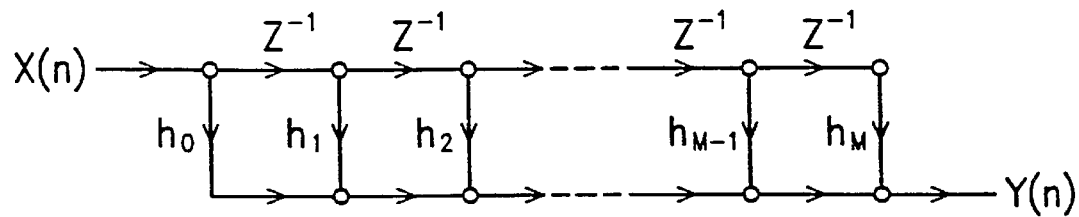
FIG. 2 shows a network diagram of a digital filter having finite impulse response (FIR) characteristics.
Figure 3:
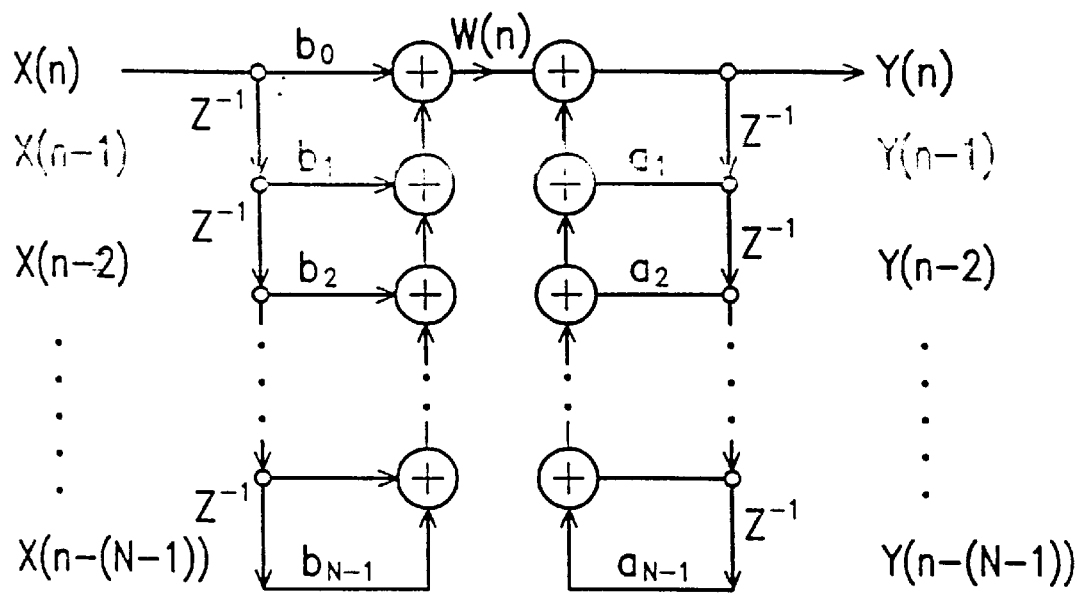
FIG. 3 shows a network diagram of a digital filter having a direct form I infinite impulse response (IIR) characteristics.
Figure 4:
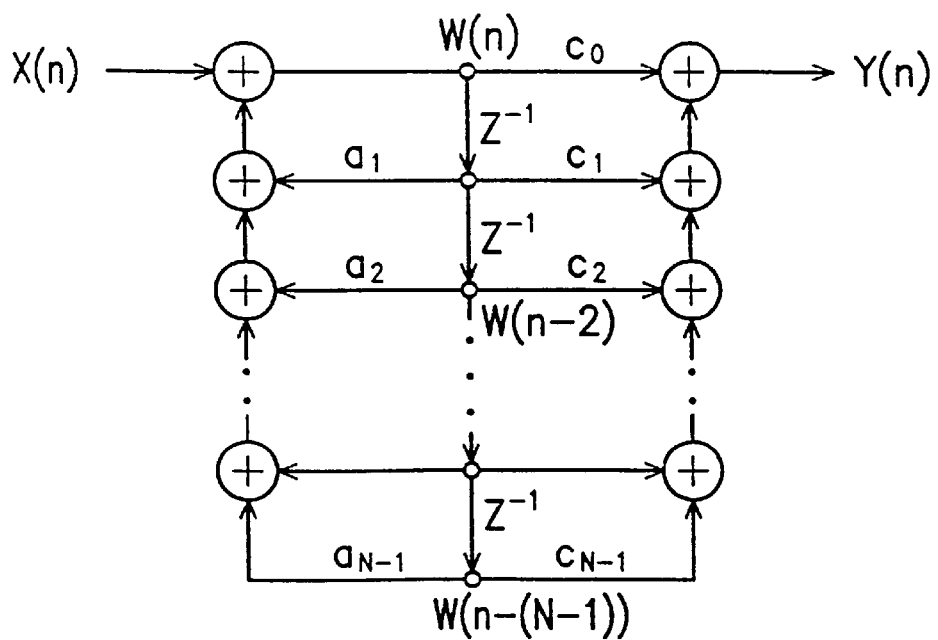
FIG. 4 shows a network diagram of a digital filter having a direct form II infinite impulse response characteristics.

Note that expression (5) is essentially the same as expression (4) described above for the direct form II IIR digital filter shown in FIG. 4. However, if the pole signal W(n) for the filter device is conveyed as expression (6) below in the binary number system with a total number of K bits of data for each signal, or, in other words, having a resolution of K bits, then $$W(n-j)=(b_{n-j}^{K-1}, b_{n-j}^{K-2}, \ldots, b_{n-j}^{0})_2 \quad (6)$$

wherein $\{b_{n-j}^p\} \in \{0,1\}$, p=0, 1, 2, ..., and K−1 is the variable for counting through all the data bits in a multi-bit resolution data signal, and j=0, 1, 2, ..., and N−1 is the variable for counting through all the time slot units;

$b_{n-j}^{K-1}$ is the most significant bit (MSB), which is the sign bit; and $b_{n-j}^{0}$ is the least significant bit (LSB).

When the sequence $\{b_{n-j}^p\}$ is utilized to express the pole signal W(n−1), W(n−j), ..., and W(0) in the decimal (number system), the value domain of $\{W(n-j)\}$ will be between +1 and −1, that is to say, $-1 \leq \{W(n-j)\} < 1$, wherein j=0, 1, 2, ..., and N−1, and the pole signal W(n−j) at the previous time may then be conveyed as in the following expression (7):

$$W(n-j)=((-1)(b_{n-j}^{K-1}+2^{-1}b_{n-j}^{K-2}+ \ldots +2^{(K-1)}b_{n-j}^{0})_{10} \quad (7)$$

Combining expression (7) into (5), expression (5) for Y(n), the filtered output signal at the current time then becomes expression (8):

$$Y(n)=(-1)(c_0 b_n^{K-1}+c_1 b_{n-1}^{K-1}+c_2 b_{n-2}^{K-1}+ \ldots )_{10}+$$
$$(2^{-1})(c_0 b_n^{K-2}+c_1 b_{n-1}^{K-2}+c_2 b_{n-2}^{K-2}+ \ldots )_{10}+$$
$$\ldots +$$
$$(2^{-K+2})(c_0 b_n^{1}+c_1 b_{n-1}^{1}+c_2 b_{n-2}^{1}+ \ldots )_{10}+$$

$$(2^{-K+1})(c_0 b_n^0 + c_1 b_{n-1}^0 + c_2 b_{n-2}^0 + \ldots)_{10}. \quad (8)$$

Each of the decimal terms in the above expression (8) is defined respectively as follows:

$$\text{0-th-order term: } (c_0 b_n^0 + c_1 b_{n-1}^0 + c_2 b_{n-2}^0 + \ldots)_{10}, \quad (9)$$

$$\text{1st-order term: } (c_0 b_n^1 + c_1 b_{n-1}^1 + c_2 b_{n-2}^1 + \ldots)_{10}, \quad (10)$$

and subsequently, $$(K-2)\text{-th-order term: } (c_0 b_n^{K-2} + c_1 b_{n-1}^{K-2} + c_2 b_{n-2}^{K-2} + \ldots)_{10} \quad (11)$$

and $$(K-1)\text{-th-order term: } (c_0 b_n^{K-1} + c_1 b_{n-1}^{K-1} + c_2 b_{n-2}^{K-1} + \ldots)_{10}. \quad (12)$$

The 0-th-order term represented by expression (9) is obtained by combining the LSB (zero-th bit, $b_n^0$) of the input signal, the LSB (zero-th bit, $b_{n-1}^0$, $b_{n-2}^0$, ... ) of the previous input signals, and the coefficients $\{c_j\}$. In a similar manner, the p-th term is obtained by combining the p-th bit ($b_n^P$) of the input signal, the p-th bit ($b_{n-1}^P$, $b_{n-2}^P$, ... ) of the previous input signal and the coefficients $\{c_j\}$, wherein $p=0, 1, \ldots$, and $K-1$. Therefore a total of K-bits of resolution are involved.

A process according to the invention for operating the digital filter device based on the distributed arithmetic algorithm as outlined in the above expression (8) can be generally described in the following procedural steps:

a. Define an accumulation term and preset it to a value of 0. The pole input signal W(n) receives K bits of signal data in a sequence, namely 0-th bit, 1st bit, . . . , and (K-1)-th bit.

b. Solve for the value of the 0-th term when the 0-th bit is being sequentially provided as the input signal, and then store the resolved result in the accumulation term. The value of the 0-th term is determined by the following formula:

$$(c_0 b_n^0 + c_1 b_{n-1}^0 + c_2 b_{n-2}^0 + \ldots)_{10}.$$

c. Divide the accumulation term by two and store it again as the accumulation term.

d. Solve for the value of the 1st term when the 1st bit is being sequentially provided as the input signal, and then store the resolved result into the accumulation term. The value of the 1st term is determined by the following formula:

$$(c_0 b_n^1 + c_1 b_{n-1}^1 + c_2 b_{n-2}^1 + \ldots)_{10}.$$

e. Add the value of the 1st term obtained in step d to the accumulation term to obtain the new accumulation term.

f. Divide the accumulation term by two and store it again as the new accumulation term.

g. When the m-th bit is being sequentially input for the input signal, repeat the above steps until the value for the m-th term is determined, wherein $m=2, \ldots, K-2$. The value of the m-th term is determined by the following formula:

$$(c_0 b_n^m + c_1 b_{n-1}^m + c_2 b_{n-2}^m + \ldots)_{10}.$$

h. Add the value of the m-th term obtained in step g to the accumulation term to obtain the new accumulation term.

i. Divide the accumulation term by two and store it again as the new accumulation term.

j. Solve for the value of the (K-1)-th term when the (K-1)-th bit is being sequentially provided as the input signal, and then store the resolved result in the accumulation term. The value of the (K-1)-th term is determined by the following formula:

$$(c_0 b_n^{K-1} + c_1 b_{n-1}^{K-1} + c_2 b_{n-2}^{K-1} + \ldots)_{10}.$$

k. Add the value of the (K-1)-th term obtained in step j into the accumulation term to obtain the new accumulation term.

l. After the last bit ((K-1)-th bit) is received, the accumulated value becomes Y(n).

The above illustrates the procedural steps of implementing the calculation of the product term for one sampling cycle utilizing the distributed arithmetic algorithm of the invention.

When determining the numerical results of a filtered signal as processed by the digital filter bank device of the invention, the above-described procedural steps may be implemented through the use of pre-stored look-up tables for determining the value of the necessary filter characteristic coefficients. In determining the numerical value of the pole signal, all K bits of the multi-bit resolution of the data signal must be processed based on the above expressions.

Based on expressions (9)–(12), which are used for determining each of the decimal terms in expression (8) for obtaining the filtered output signal value at the current time Y(n), each of the 0-th 1st, 2nd, . . . , and (K-1)-th-order terms involves individual corresponding computational procedures to calculate the summation of products.

Due to the fact that $b_{n-j}^P \in \{0,1\}$ (a binary value of either 0 or 1), there will therefore be a total of $2^N$ possible value domains for each of the p-th-order terms in expressions (9)–(12) when determining the value for each of the resolution bits of the data signal. These domain data may be stored in suitable semiconductor memory such as read-only memory (ROM) or programmable array logic (PAL) devices. The memory device may employ the sequence ($b_{n-1}^P$, $b_{n-2}^P$, . . . , $b_0^P$) as the data address for storage in the device addressing space for the domain data corresponding to the p-th bit of the K resolution bits.

For example, if a ROM device is used to store these domain data, a device having an addressing space for holding those $2^N$ words, each having a data width of K bits, would be required.

Take, for example, a case wherein a total of two (N=2) time slot units are used for the analysis, the variable j will be in the range of 0 to 1. Thus, a ROM device for the storage of domain data will have the following list showing the relationship between the memory address and its correspondingly held domain data:

| Address ($b_n^P$, $b_{n-1}^P$) | Domain Data |
| --- | --- |
| (0,0) | 0 |
| (0,1) | $C_1$ |
| (1,0) | $C_0$ |
| (1,1) | $C_0 + C_1$ |

Figure 8:
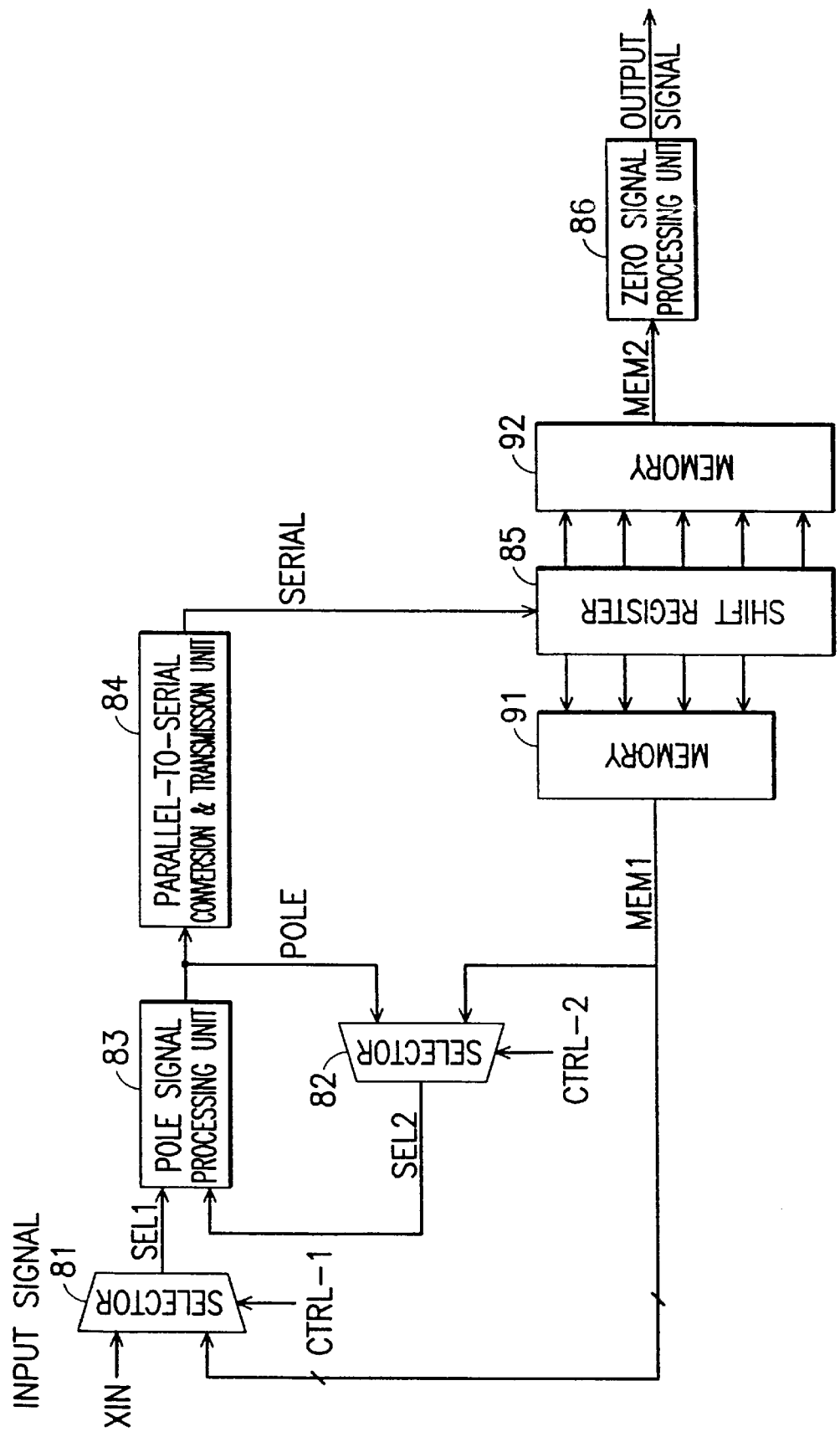
FIG. 8 is a block diagram schematically showing the hardware configuration of a filter bank unit that includes the digital filter bank device of FIG. 7, employing a distributed arithmetic algorithm, in accordance with a preferred embodiment of the invention.

FIG. 8 is a block diagram schematically showing the hardware configuration of a substantial equivalent of the filter bank unit 30 that is included in the digital filter bank device 10 of FIG. 7, employing a distributed arithmetic algorithm in accordance with a preferred embodiment of the invention. Note that although FIG. 7 had specifically employed the term filters, either high-pass, band-pass, or low-pass, as the components constituting the filter bank unit 30, in the embodiment depicted in FIG. 8, no "filter" functional blocks are shown to exist. This is because the outlined functional blocks, such as the pole signal processing unit 83, the parallel-to-serial conversion and transmission unit 84, and the zero signal processing unit 86 in FIG. 8 are, as will be described in detail below, combined to implement the functions of those digital filters outlined in FIG. 7.

Before proceeding to the description of this substantial equivalent of the filter bank unit 30 of FIG. 7, it should be pointed out that its use is specifically suitable for the direct form II IIR digital filter bank device, as outlined in the network diagram of FIG. 4. Also to be pointed out is that the distributed arithmetic algorithm described previously is the underlying concept of operation. As clearly shown in FIG. 8, this substantial equivalent of the filter bank unit 30 includes eight functional blocks. These blocks are selectors 81 and 82, a pole signal processing unit 83, a parallel-to-serial conversion and transmission unit 84, a shift register 85, memories 91 and 92, and a zero signal processing unit 86.

As mentioned above in expression (4), in the IIR digital filter of FIG. 4, a numerical expression may be set up for the filtered output Y(n), based on an intermediate pole signal W(n) as:

$$Y(n)=c_0 \times W(n)+c_1 \times W(n-1)+c_2 \times W(n-2)+ \ldots +c_{N-1} \times W(n-(N-1)). \quad (4)$$

The pole signal W(n), based on the above expression (3), is obtained from an input data signal X(n) by:

$$W(n)=X(n)+a_1 \times W(n-1)+a_2 \times W(n-2)+ \ldots +a_{N-1} \times W(n-(N-1)). \quad (3)$$

Utilizing a simplified designation, (4) and (3) may be expressed respectively as:

$$Y(n) = \sum_{j=0}^{N-1} c_j \cdot W(n-j) \quad (13)$$

and $$W(n) = X(n) + \sum_{j=0}^{N-1} a_j \cdot W(n-j). \quad (14)$$

With reference again to FIG. 4 of the drawing, it can be seen that evaluation of the intermediate pole signal W(n) as described in the above expression (14) is performed utilizing the left-hand portion of the network diagram, which is shown generally divided into two portions at the center. In the block diagram of FIG. 8, this corresponds to the portion of the overall circuitry that includes anything to the left of the shift register 85. Thus, this includes the selector 81, the pole signal processing unit 83, the selector 82, the parallel-to-serial conversion and transmission unit 84 and the memory 91. On the other hand, evaluation of the filter bank unit (30 of FIG. 7) output signal Y(n) as described in the above expression (13) is performed utilizing the other half portion of the network diagram to the right of the shift register 85. This would include the zero signal processing unit 86 and the memory 92. Specifically, the memory 91 contains an addressable memory content that can be accessed in the form of a look-up table for the filter characteristic coefficients $a_1$-$a_N$, while the memory 92 contain the look-up table for coefficients $c_0$-$c_{N-1}$.

In a procedure necessary for computational processing for obtaining the filter device output data based on the distributed arithmetic algorithm, the coefficient look-up table access and the basic operation of summation of products may be implemented utilizing the hardware of FIG. 8 in a process to be described below. With reference to FIGS. 11–22, which show embodiments of circuitry as well as the corresponding timing diagrams for several of the eight constituent components 81–86 and 91–92 of FIG. 8, the process for numerically obtaining the filter output may be outlined as follows:

a. Initialize the summation of products procedure by storing an initial product term in an accumulator means. This can be performed by, for example, storing an initial value for the product term $a_j \cdot W(n-j)$ in expression (14) in a stage register set 833 of the pole signal processing unit 83, shown in FIG. 15.

b. Control the filter bank to allow for the input signal to be processed and provided to the pole signal processing unit. This can be performed by, for example, issuing the control signal CTRL-1 shown in FIG. 8 to a first selector 81, so that the input data signal XIN (SEL1) may be selected by selector 81 and provided to the pole signal processing unit 83 connected thereto.

c. A pole signal processing unit adds the input signal into a product term held in the accumulator means to obtain a pole signal. This can be performed by, for example, allowing the pole signal processing unit 83 to add the XIN (SEL1) data signal into the value $a_j \cdot W(n-j)$ in the stage register set 833 of the pole signal processing unit 83 of FIG. 15, obtaining a pole signal POLE, or otherwise the intermediate pole signal W(n).

d. A pole signal processing unit sends its processed signal to a parallel-to-serial conversion and transmission unit and to a second selector. This can be performed by, for example, the register 831 in the pole signal processing unit 83 of FIG. 15 sending the pole signal POLE obtained in step c to the parallel-to-serial conversion and transmission unit 84 for parallel-to-serial conversion and then further transmission outward, as well as to the second selector 82 for selected feedback to itself.

e. A parallel-to-serial conversion and transmission unit converts and transmits the processed data signal in a sequence of serial bits to a shift register. This can be performed by, for example, the parallel-to-serial conversion and transmission unit 84 embodied in FIG. 17 sending the converted bits of the pole signal POLE, or W(n) held in the register 842 in a form of multiple resolution bits (such as 16 bits exemplified above) in a serial sequence to the shift register 85 of FIG. 8. The transmission may be in an order from LSB to MSB or may be the reverse.

f. A shift register addresses a memory location in a first and a second memory means upon receiving each of the corresponding bits of the 0-th-order term of data signal processed, converted, and transmitted by the parallel-to-serial conversion and transmission unit. This can be performed by, for example, the shift register 85, upon receiving each of the W(n) data bits ($b_n^0$, $b_{n-1}^0$, $b_{n-2}^0$, ...) of the 0-th-order term transmitted by the parallel-to-serial conversion and transmission unit 84, addressing one memory location in the designated address space of memories 91 and 92 that corresponds to the received data bit.

g. A first and second memory means fetch respective memory contents held in the memory locations corresponding to that addressed by the shift register. This can be performed by, for example, the memories 91 and 92 fetching their respective memory contents MEM1 and MEM2 held in the memory locations corresponding to that addressed by the shift register 85 receiving W(n) data bits ($b_n^0, b_{n-1}^0, b_{n-2}^0, \ldots$) of the 0-th-order term.

h. Control to allow for the 0-th-order term data held by the first memory to be fetched to the pole signal processing unit and stored therein. This can be performed by, for example, issuing a control signal CTRL-2 to a second selector 82 so that the 0-th-order term memory content MEM1 (SEL2) held in the memory 91 may be selected by the selector 82 and fetched to the register 833 of the pole signal processing unit 83 of FIG. 15.

i. The second memory means fetches its addressed 0-th-order term memory content to a zero signal processing unit. This can be performed by, for example, the memory 92 fetching the 0-th-order term memory contents MEM2 and sending the contents to a register 861 and subsequently to the stage register set 863 of the zero signal processing unit 86 shown in FIG. 21.

j. A shift register sends a 1st-order term of the pole signal data received from the parallel-to-serial conversion and transmission unit to both the first and second memory means. This can be performed by, for example, the shift register 85 sending the direct and non-reprocessed 1st-order term pole signal data W(n) having data bits ($b_n^1, b_{n-1}^1, b_{n-2}^1, \ldots$), as received from the parallel-to-serial conversion and transmission unit 84, to the memories 91 and 92.

k. A first and second memory means fetch the respective addressed 1st-order term memory contents. This can be performed by, for example, the memory 91 fetching the addressed 1st-order term memory content MEM1 and memory 92 fetching the addressed 1st-order term memory content MEM2, both addressed by the 1st-order term pole signal data W(n) having data bits ($b_n^1, b_{n-1}^1, b_{n-2}^1, \ldots$).

l. Control to allow for the 1st-order term data held by the first memory to be fetched to the pole signal processing unit. This can be performed by, for example, issuing a control signal CTRL-1 to the first selector 81 so that the 1st-order term memory content MEM1 held in the memory 91 may be selected by the selector 81 and fetched to the pole signal processing unit 83.

m. A pole signal processing unit divides the 0-th-order term data held in step h a designated number of folds and adds it to the 1st-order term data to obtain the new pole signal. This can be performed by, for example, the pole signal processing unit 83 dividing the 0-th-order term data held in step h two folds and adding it to the 1st-order term data MEM1 for obtain the new pole signal POLE and storing it in the register 831 of the pole signal processing unit 83 shown in FIG. 15.

n. A pole signal processing unit fetches the new pole signal obtained in step m only to the second selector. This can be performed by, for example, the pole signal processing unit 83 fetching the new pole signal POLE obtained in step m only to the second selector 82 and not to the parallel-to-serial conversion and transmission unit 84, so that the pole signal W(n) held therein may not be refreshed.

o. A second memory means fetches 1-st order term data to the zero signal processing unit, which adds it to the 0-th-order term data that has been divided a designated number of folds. This can be performed by, for example, by memory 92 fetching the 1st-order term data MEM2 to the zero signal processing unit 86 shown in FIG. 21, which adds the 0-th-order term data fed back by register 863 in step i that has been divided two folds, to the 1st-order term data MEM2 and holds the added result in the register 861 of the zero signal processing unit 86.

p. A zero signal processing unit repeats to complete and generate the filtered signal data. This can be performed by, for example, repeatedly processing completely all the bits comprising the pole signal data W(n) that are generated by the stage register set 863 of the zero signal processing unit 86 as the filtered signal Y(n).

q. A pole signal processing unit generates a sum of products for a zero signal processing unit to generate as the device filtered output and returns to step a until all order terms are complete. This can be performed by, for example, the pole signal processing unit 83 accumulating the $a_j W(n+1-j)$ terms in its stage register set 833 and allowing the stage register set 863 of the zero signal processing unit 86 to generate the device filtered signal Y(n). Then, the procedure returns to step a until all order terms are completed.

The above description generally illustrates a process implementing digital signal filtering in a digital filter bank device such as that depicted in FIG. 7. The filter bank unit 30 in FIG. 7 that is detailed in FIG. 8 includes several constituent components, which, although each may include electronic functional elements known in the art, are combined to uniquely achieve the functionality that is useful for digital signal processing according to the invention. Those components known to persons skilled in the art will not be described in further detail herein; however, several of the constituent components that are unique will require certain elaboration with reference to FIGS. 11–22 of the drawing.

Figure 11:
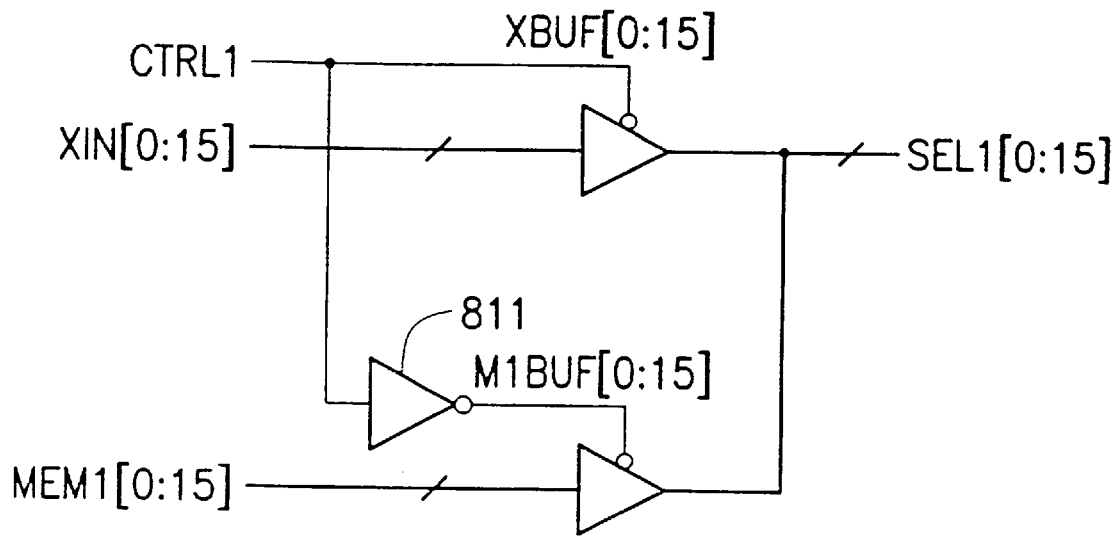
FIG. 11 is a schematic diagram of a selector for the digital filter bank unit of FIG. 8, in accordance with a preferred embodiment of the invention.
Figure 12:
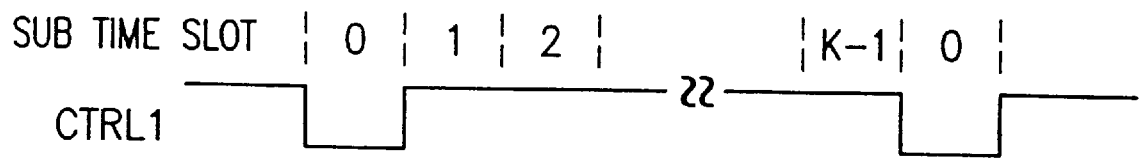
FIG. 12 shows an operating timing diagram of the selector of FIG. 11.

FIG. 11 is a schematic diagram of a selector 81 for the digital filter bank unit 30 of FIG. 8 in accordance with the preferred embodiment of the invention, while FIG. 12 shows an operating timing diagram thereof. As shown in FIG. 11, which depicts a selector suitable for processing a digital input signal with a resolution of 16 bits, the selector 81 generally includes two sets of a number of tri-state buffers XBUF[0:15] and M1BUF[0:15]. Each of the first set of 16 tri-state buffers XBUF[0:15] receives the corresponding data signal bit of the 16-bit input digital signal XIN[0:15]. Similarly, each of the second set of 16 tri-state buffers M1BUF[0:15] receives the corresponding signal bits of 16-bit the feedback signal MEM1[0:15].

The corresponding outputs of the tri-state buffers in the two sets XBUF[0:15] and M1BUF[0:15] are tied together, resulting in a total of 16 output signal bits SEL1[0:15] that compose the selector output SEL1 of FIG. 8. The buffer output enable controls of the first set of tri-state buffers XBUF[0:15] are tied together and connected directly to the signal CTRL-1. This line is connected directly to the enable controls of the first set XBUF[0:15], while the enable controls of the second set M1BUF[0:15] are controlled by an inverted version of the CTRL-1 signal, as shown in the drawing by the presence of the inverter 811 that inverts the signal CTRL-1 before controlling the tri-state buffers. Thus, the selector 81 of FIG. 11 is capable of selecting either the input signal XIN[0:15] or the feedback signal MEM1[0:15] under the control of the signal CTRL-1. The selection of either one is based on the timing sequence depicted in FIG. 12. In a signal processing example involving a data resolution of K bits, the selection scheme may be implemented in processing time slots sub-divided in to K units 0, 1, . . . , and K–1, as shown in FIG. 12. The timing diagram of FIG. 12 thus only depicts the scheme for selecting the XIN signal in time slot 0 for the LSB of the processed data.

Figure 13:
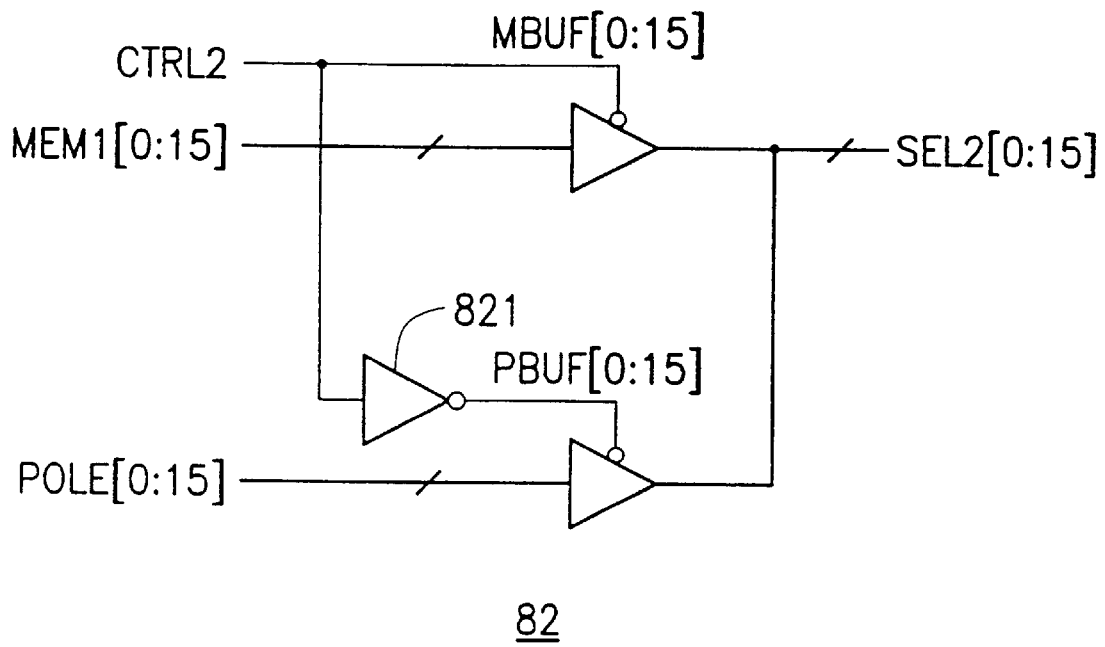
FIG. 13 is a schematic diagram of another selector for the digital filter bank unit of FIG. 8, in accordance with the preferred embodiment of the invention.
Figure 14:
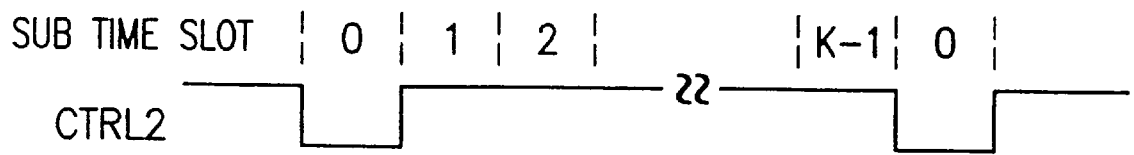
FIG. 14 shows an operating timing diagram of the selector of FIG. 13.

For the other selector 82 of the digital filter bank unit 30 of FIG. 8, the schematic diagram of FIG. 13 shows a design implementation thereof. FIG. 14 shows the operating timing diagram of the selector of FIG. 13. The embodiment of selector 82 of FIG. 13 is similar in hardware circuitry configuration to that of the selector 81 depicted in FIG. 11, except tri-state buffer set MBUF[0:15] selects the multi-bit feedback signal MEM1[0:15], while PBUF_0–15 selects the multi-bit pole signal POLE[0:15]. Either the feedback MEM1 or pole POLE signal is selected by the controlling signal CTRL-2 to be the selected output signal SEL2 of the selector 82. The buffer set MBUF[0:15] is connected directly to CTRL-2 to select MEM1[0:15] when CTRL-2 is asserted. An inverter 821 is likewise used for obtaining an inverted version of the CTRL-2 signal for the selection control of the PBUF[0:15] to select POLE[0:15].

Figure 15:
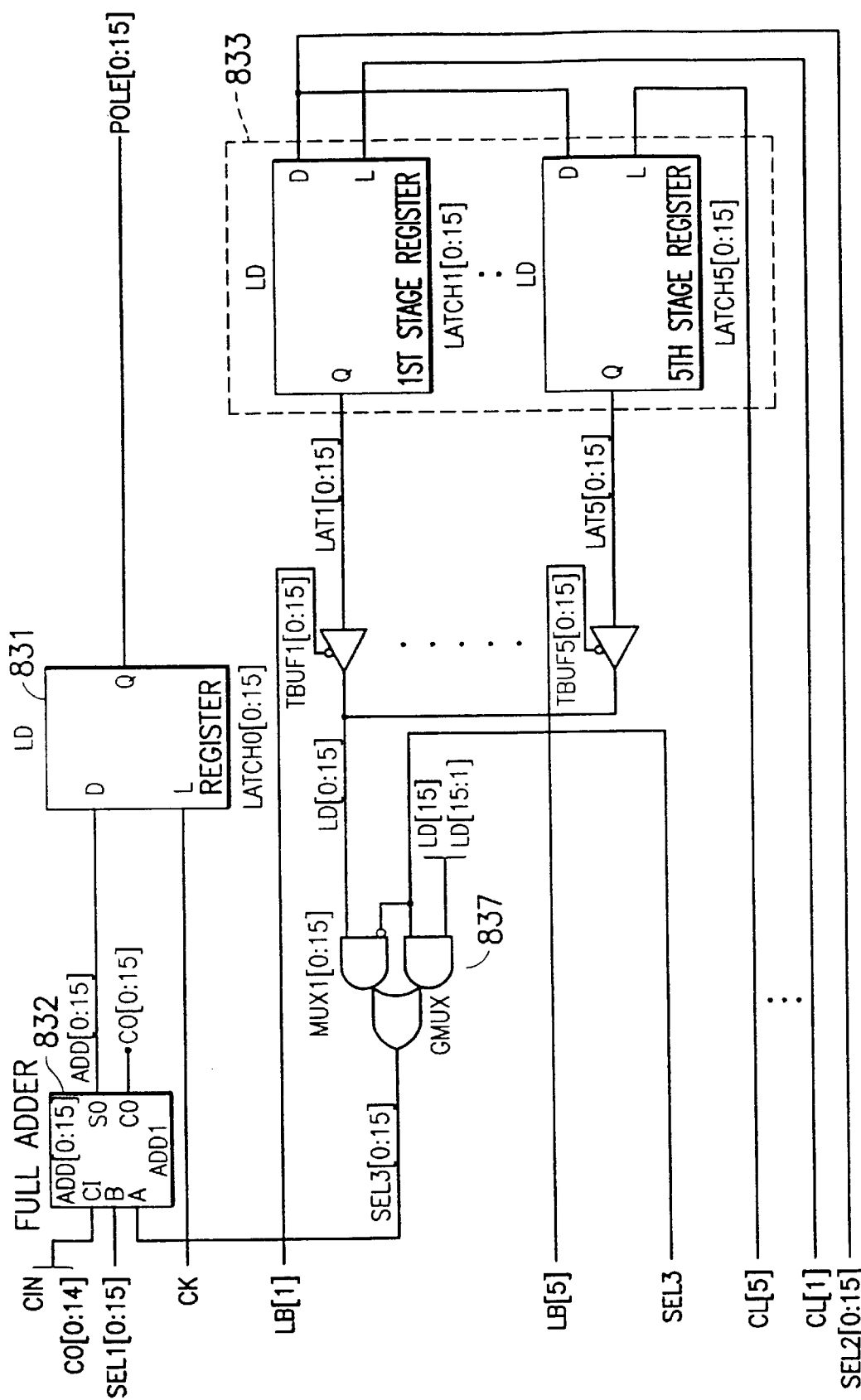
FIG. 15 is a schematic diagram of the pole signal processing unit of FIG. 8, in accordance with a preferred embodiment of the invention.

FIG. 15 is a schematic diagram of the pole signal processing unit 83 of FIG. 8, in accordance with a preferred embodiment of the invention. As the drawing shown, the pole signal processing unit 83 generally includes a register array 831, an adder array 832, a set of stage register arrays 833, and some supporting logic in the form of an AND-OR gate array 837. Again, since the pole signal processing unit 83 is a constituent component of the digital filter bank unit 30, the example shown in FIG. 15 assumes processing of a digital signal data having a resolution of 16 bits. This is expressed in the drawing by labeling such as LATCH0[0:15], ADD[0:15], LATCH1[0:15], . . . , LATCH5[0:15], and MUX1[0:15], . . . , and MUX5[0:15] for the components.

In general, with reference back to FIG. 8, the described pole signal processing unit 83 receives two input signals SEL1 and SEL2 for processing and generating the output pole signal POLE. The detailed logic of FIG. 15, however, shows that further control signals are also involved in the processing. Specifically, these include LB[1]–LB[5], respectively, which are the inverted version of stage status control signals L[1]–L[5], stage register control signals CL[1]–CL[5] for the first to the fifth stages of the set of five stage registers LATCH1–5 of array 833, as well as the conditioning signal SEL3 for the AND-OR gates MUX1–5 of array 837, which decides whether or not the input SEL2 is to be divided M-fold, or, divided by two in the described embodiment. Essentially, the first data signal SEL1[0:15], having a resolution of 16 bits, provided to the pole signal processing unit 83 constitutes the B input of the adder ADD of the adder array 832, while the second data signal SEL2[0:15] is the data input to each of the set of stage register arrays 833.

Figure 16:
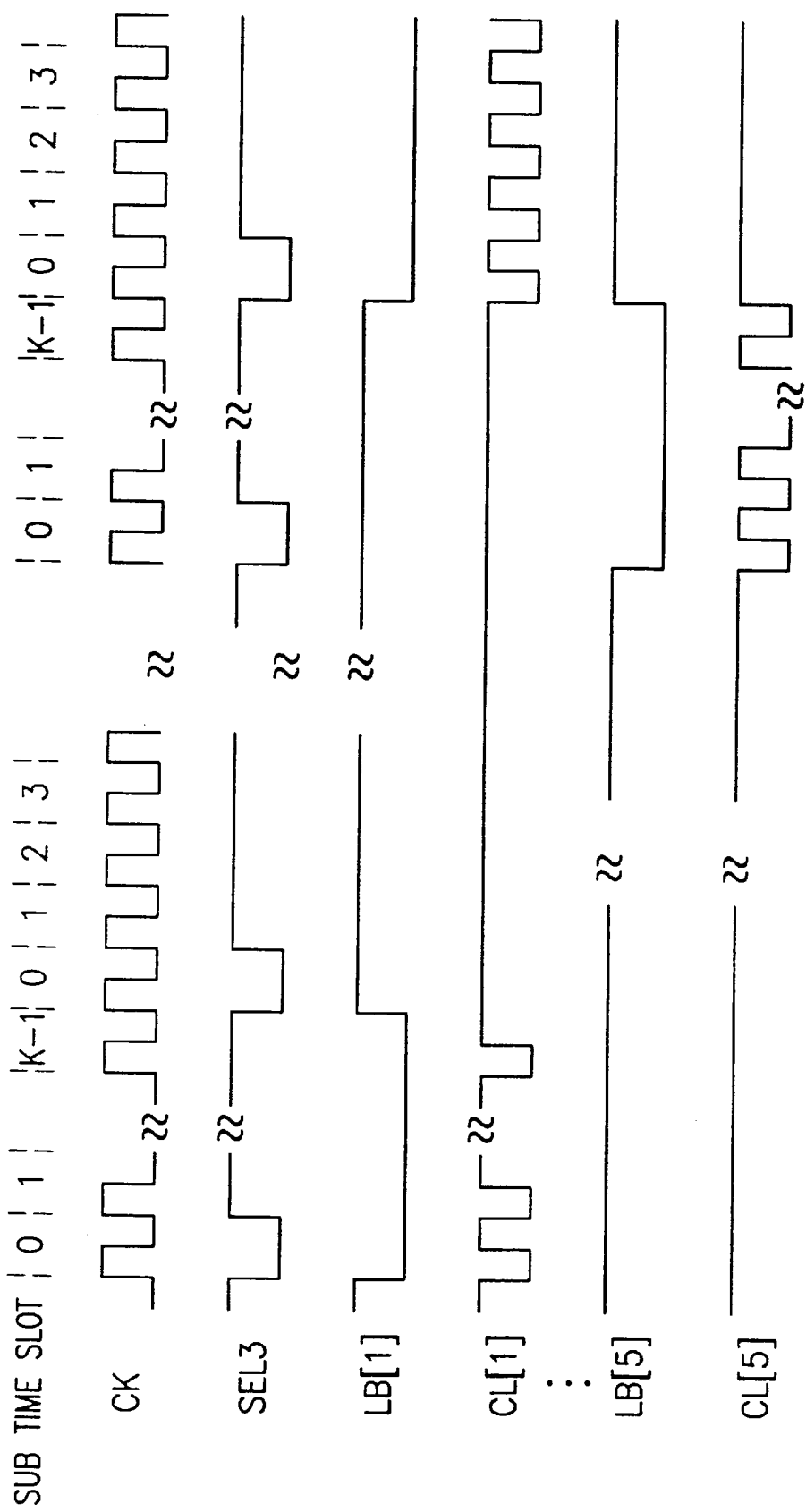
FIG. 16 shows an operating timing diagram of the pole signal processing unit of FIG. 15.

In operation, the second data signal SEL2[0:15] is first latched into the selected one of the stage registers LATCH1–5 in the array 833 by the activated one of the latch control signals CL[1]–CL[5]. The selection is made of one from among the five stages of the depicted embodiment. The inverted stage status control signals L[1]–L[5] then select one register in the array 833 for transmission to the corresponding AND-OR gate array 837. The selected gate in array 837, under conditioning of the signal SEL3, fetches the selected register content in the array 833 to the A port of the adder 832. The unit 83 is driven by a clock signal CK that is directly relayed to the data load control signal of the register 831, which receives the output of adder array 832, and generates the POLE output of the pole signal processing unit 83 at its Q port. In the example of of FIG. 15, the adder array 832 also involves carry-ins and carry-outs CIN and CO[0:14], respectively, FIG. 16 shows the operational timing diagram of the pole signal processing unit 83 of FIG. 15.

Figures 17, 18:
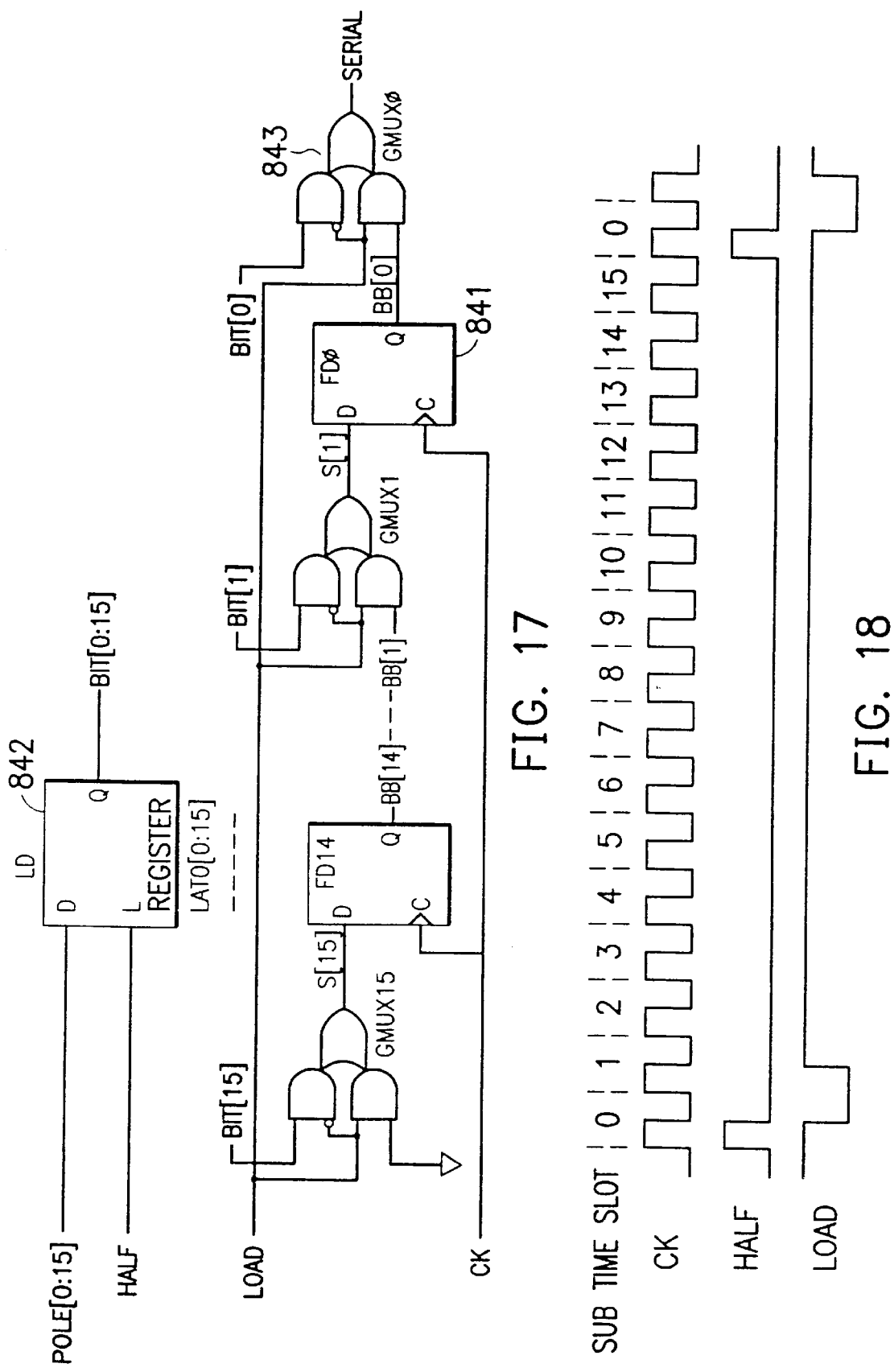
FIG. 17 is a schematic diagram of the parallel-to-serial conversion and transmission unit of FIG. 8, in accordance with a preferred embodiment of the invention.
FIG. 18 shows an operating timing diagram of the parallel-to-serial conversion and transmission unit of FIG. 17.

FIG. 17 is a schematic diagram of the parallel-to-serial conversion and transmission unit 84 of FIG. 8 in accordance with a preferred embodiment of the invention, and FIG. 18 is the corresponding timing diagram. This is a parallel-to-serial conversion unit including a cascaded array 841 of flip-flop type registers FD[0:14]. An array 842 of registers LAT0[0:15] for latching the 16 bits of processed data, namely the pole data POLE[0:15], as generated by the pole signal processing unit 83, is controlled by a signal HALF that holds the data for one time slot unit of time and generates an output designated as bits BIT[0:15]. A control signal LOAD provides data input control to each of the registers FD[0:14] in the array 841 after each of the corresponding bits BIT[0:15] received from the arrayed registers 842 is conditioned by the Q output of the previous stage via a corresponding one of the AND-OR gates GMUX0–15 in the array 843, as well as by the corresponding bits of BIT[0:15]. This circuit arrangement allows the data BIT[0:15] to be loaded into the flip-flop type registers FD[0:14] when the LOAD signal is driven to a logical low (LOAD=0, that is), and the clock CK signal changes state. As shown in FIG. 18, the operation of the parallel-to-serial conversion and transmission unit 84 of FIG. 8 allows for the parallel-to-serial conversion of the parallel 16-bit POLE[0:15] signal into the desired serial signal SERIAL.

Figure 19:
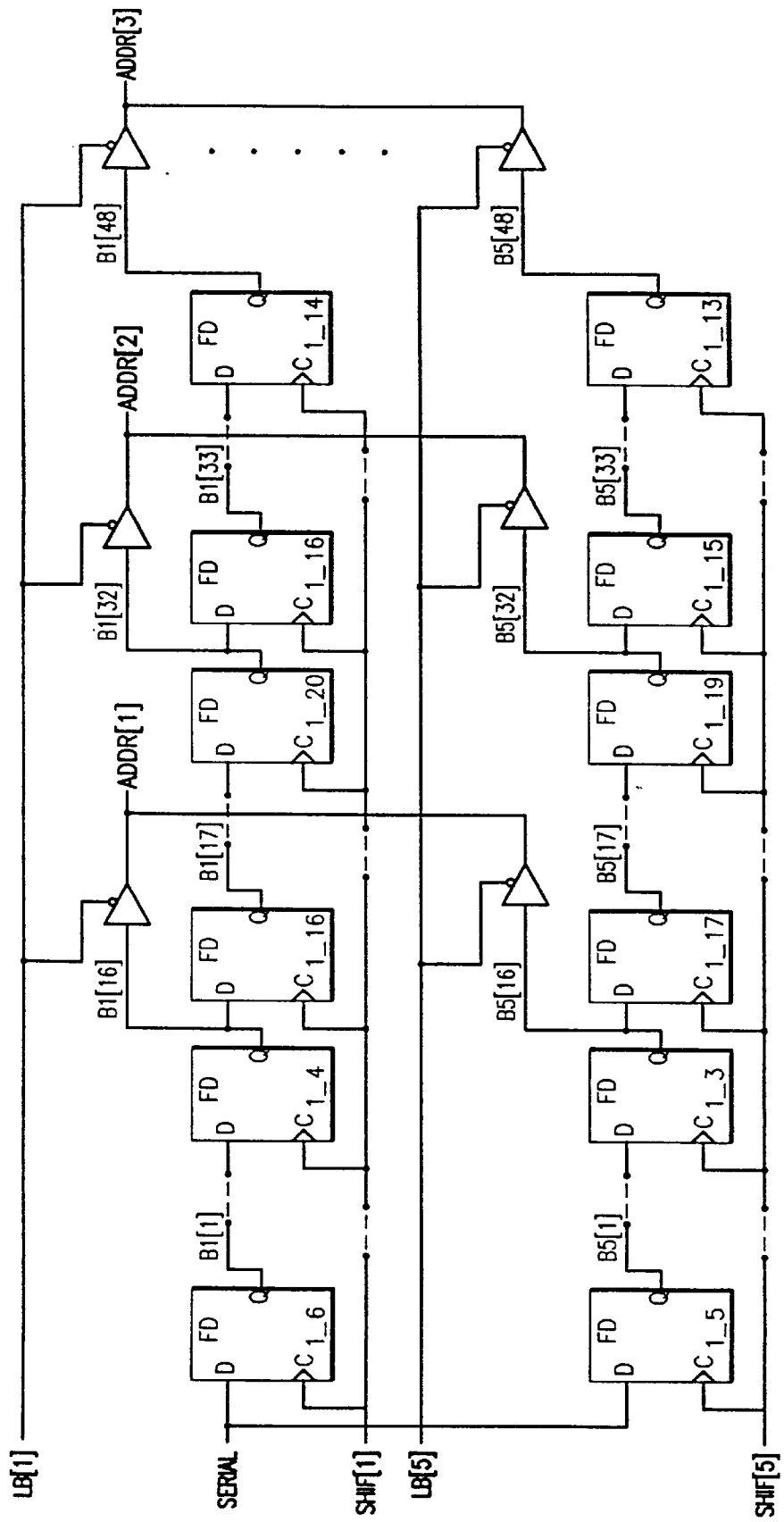
FIG. 19 is a schematic diagram of the shift register of FIG. 8, in accordance with a preferred embodiment of the invention.
Figure 20:
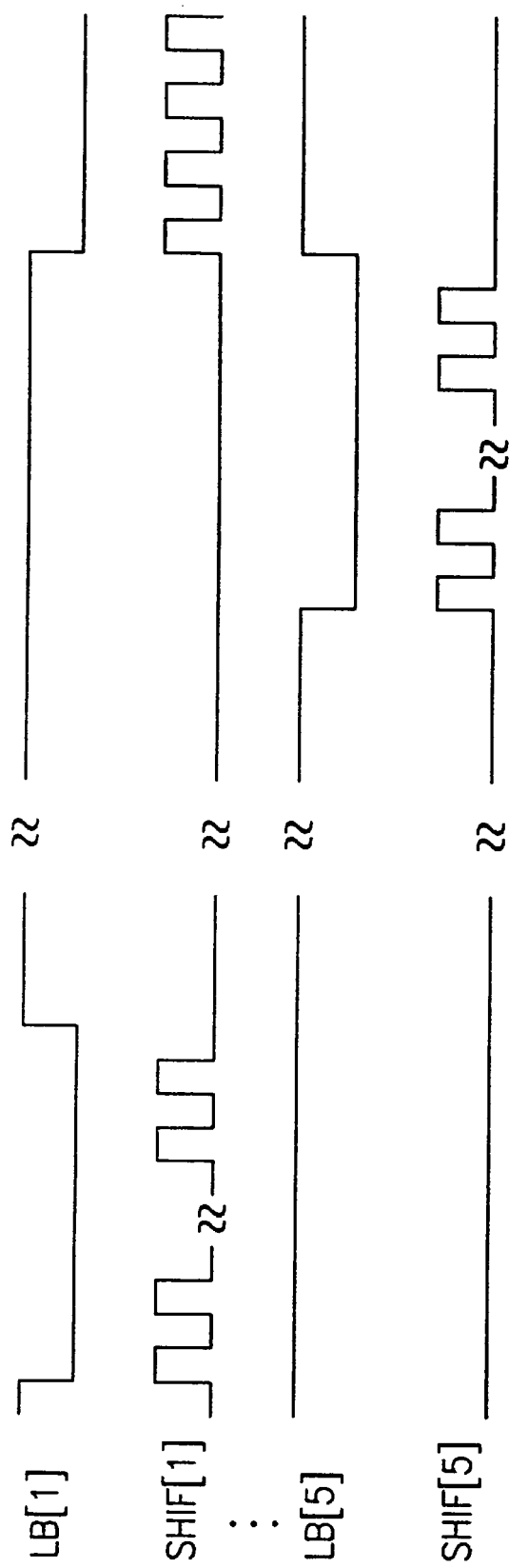
FIG. 20 shows an operating timing diagram of the shift register of FIG. 19.

FIG. 19 is a schematic diagram of the shift register 85 of FIG. 8 in accordance with a preferred embodiment of the invention. As shown in FIG. 8, the shift register 85 receives and holds the serial data, as provided by the parallel-to-serial conversion and transmission unit 84, in a clocked sequence. SHIF[1]–SHIF[5] are used to clock the successive shifting of the incoming data bits in the five stages. The inverted versions of the stage status control signals L[1]–L[5], namely LB[1]–LB[5] are used for individually selecting the source of the five stages to construct the address signal bits ADDR[1]–ADDR[3], as exemplified in the logic of the drawing, based on the timing sequence of FIG. 20. The constructed address signal bits ADDR[1:3] are then provided to the memory devices 91 and 92 (FIG. 8) for accessing the coefficient data stored in proper format in the look-up table held therein. These memory devices may be, for example, conventional ROMs, PALs, or any other suitable semiconductor memory devices.

Figure 21:
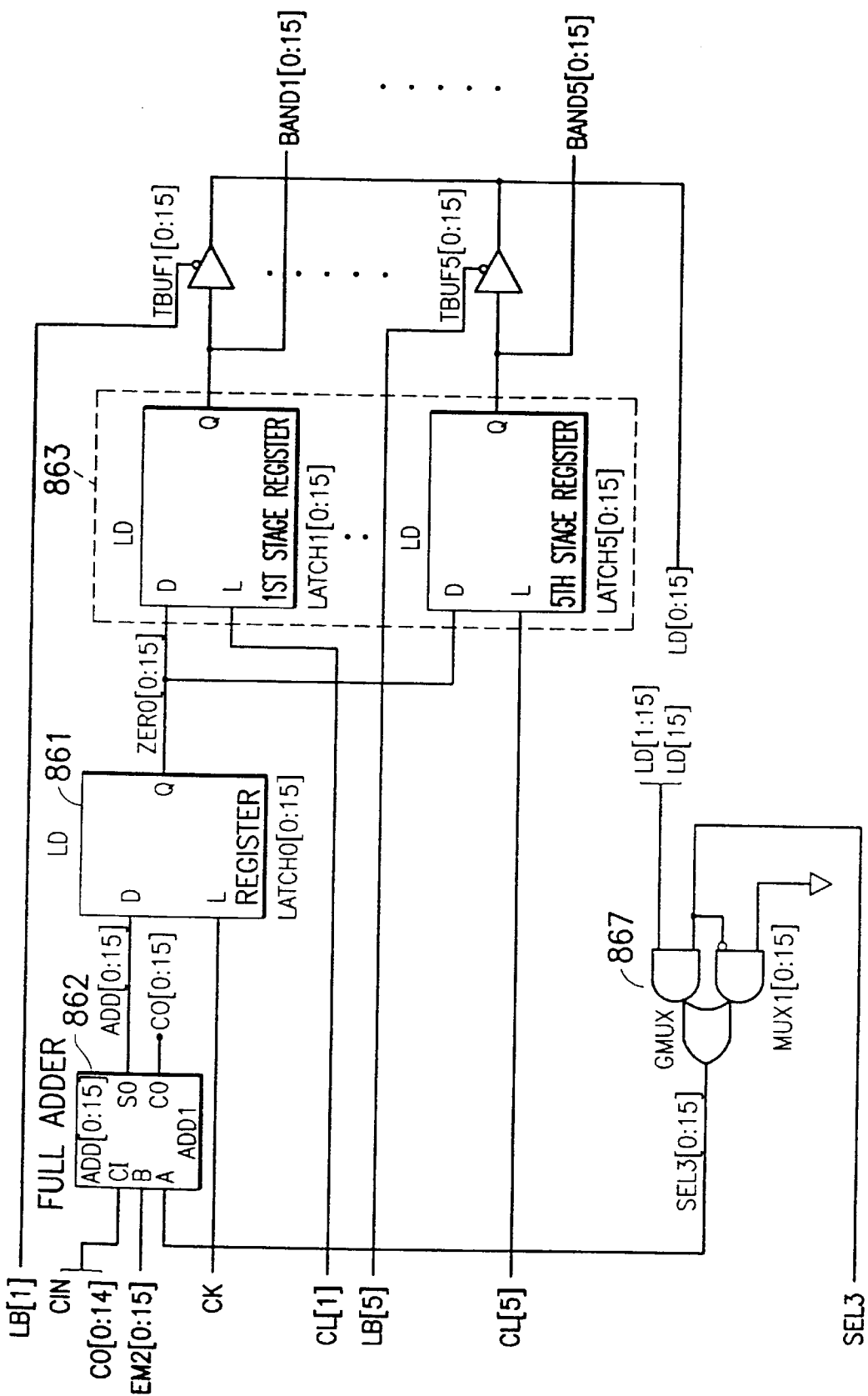
FIG. 21 is a schematic diagram of the zero signal processing unit of FIG. 8, in accordance with a preferred embodiment of the invention.

FIG. 21 is a schematic diagram of the zero signal processing unit 86 of FIG. 8, in accordance with a preferred embodiment of the invention. As shown in the drawing, the zero signal processing unit 86 includes a register array 861, an adder array 862, a set of stage register arrays 863, and supporting logic in the form of and AND-OR gate array 867. Still, since the zero signal processing unit 86 is a constituent component of the digital filter bank unit 30, the example shown in FIG. 21 again depicts a digital signal data having a resolution of 16 bits. This is accounted for in the drawing by labeling such as LATCH0[0:15], ADD[0:15], LATCH1[0:15], . . . , LATCH5[0:15], and MUX1[0:15], . . . , and MUX5[0:15] for the components.

With reference back again to FIG. 8, the described zero signal processing unit 86 receives the input signal MEM2 for processing and generating the output signal, which in this case is the final output of the filtered signal for the digital filter bank unit 30, labeled as signals 371–375 of FIG. 7, or as HIGH1[0:15], . . . , HIGH5[0:15] in the description of the frequency band select unit 40 shown in FIG. 10. However, the detailed logic of FIG. 21 shows that further control signals are also involved in the processing. Specifically, these include LB[1]–LB[5], the inverted version of stage status control signals L[1]–L[5], respectively, stage register control signals CL[1]–CL[5] for the first to the fifth stages of the set of five stage registers LATCH1–5 of array 863, as well as the conditioning signal SEL3 for the AND-OR gates MUX1–5 of array 867 that decides whether or not the input MEM2 is to be divided M-fold, or, divided by two, in the described embodiment. Essentially, the data signal MEM2 [0:15] having a resolution of 16 bits, provided to the zero signal processing unit 86, is the B input of the adder ADD of the adder array 862.

Figure 22:
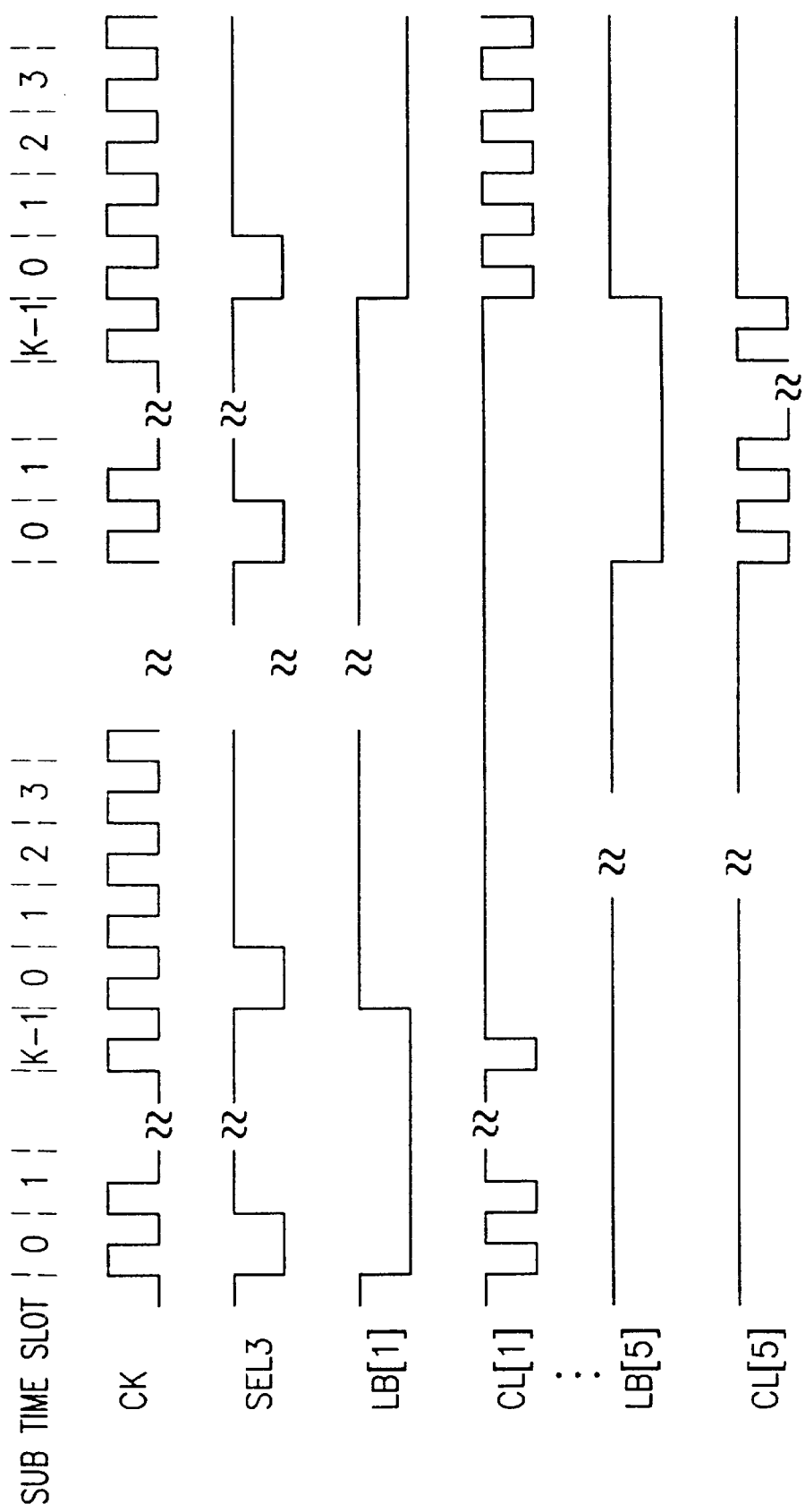
FIG. 22 shows an operating timing diagram of the zero signal processing unit of FIG. 21.

In operation, each bit of the data signal MEM2[0:15] is relayed to the B port of the adder array 862, while the A port thereof is provided with the feedback version of the data held in the selected one of the five stage registers LATCH1–5 of array 863. The selection of any of the five stages is determined by the status of the latch control signals CL[1]–CL[5]. The inverted stage status control signals L[1]–L[5] then select one register in the array 863 for transmission to its corresponding AND-OR gate in the array 867. The selected gate in the array 867, under conditioning of the signal SEL3, fetches the selected register content in the array 863 to the A port of adder in array 862. As in the case when the pole signal processing unit 83 was described with reference to FIG. 15, the zero signal processing unit 86 is driven by a clock signal CK that is directly relayed to the data load control signal of the register 861, which receives the output of adder array 862, and generates at the Q port the signal ZERO[0:15], which becomes the output of the zero signal processing unit 86. In the described example of operation of FIG. 21, the adder array 862 also utilizes carry-ins and carry-outs CIN and CO[0:14], respectively. FIG. 22 shows the operation timing diagram of the zero signal processing unit 86 of FIG. 21.

While the invention has been described by way of example and in terms of preferred embodiments, it is to be understood that the invention is not limited to the disclosed embodiments. For example, the digital filter bank array is not limited to a depth of five stages, and the data signal is not limited to a resolution of 16 bits. The invention, therefore is intended to cover various modifications and similar arrangements. The scope of the appended claims should be accorded the broadest interpretation so as to encompass all such modifications and similar structures.

What is claimed is:

1. A digital signal filter bank device for filtering an external input signal to generate a filtered digital output signal, the device comprising:

an input signal selector to select between the external input signal and a low-pass filtered feedback signal to provide a filter input signal;

a filter bank to receive the filter input signal and to filter the filter input signal to concurrently generate both a high-pass filtered signal and a low-pass filtered signal, wherein the low-pass filtered signal includes a low-pass filtered output signal and the low-pass filtered feedback signal; and a frequency band selector to receive both the high-pass filtered signal and the low-pass filtered output signal directly from the filter bank to generate the filtered digital output signal;

wherein the filter bank includes a logic circuit to apply a distributed arithmetic algorithm to the filter input signal to generate first and second summations of product terms respectively representing the high-pass filtered signal and the low-pass filtered signal; and wherein the filter bank further includes a low-pass filter to generate the low-pass filtered feedback signal using a decimated sampling rate.

2. The digital signal filter bank device of claim 1, wherein the filter bank includes a plurality of filters organized as one bank of filters, wherein the plurality of filters generate a plurality of filtered outputs having a plurality of frequency bands, and wherein each of the plurality of frequency bands, at most, slightly overlaps another of the plurality of frequency bands.

3. The digital signal filter bank device of claim 2, wherein the plurality of filters includes a high-pass filter to generate the high-pass filtered signal and a low-pass filter to generate the low-pass filtered signal.

4. The digital signal filter bank device of claim 3, wherein the high-pass filter and the low-pass filter simultaneously receive the filter input signal.

5. The digital signal filter bank device of claim 2, wherein the plurality of filters includes a high-pass filter to generate the high-pass filtered signal, a low-pass filter to generate the low-pass filtered signal, and a plurality of band-pass filters to generate a plurality of band-pass filtered signals, and wherein the frequency band selector is further responsive to the plurality of band-pass filtered signals to generate the filtered digital output signal.

6. The digital signal filter bank device of claim 5, wherein the high-pass filter, the low-pass filter, and the plurality of band-pass filters simultaneously receive the filter input signal.

7. The digital signal filter bank device of claim 5, wherein the frequency band selector includes a first plurality of arrays of tri-state buffers having a plurality of output lines, wherein the first plurality of arrays of tri-state buffers includes:

a first array of tri-state buffers, a second array of tri-state buffers, and a second plurality of arrays of tri-state buffers, wherein the plurality of output lines are tied to form a device output to carry the device output signal, wherein the first array of tri-state buffers includes a first input to receive the high-pass filtered signal, wherein the second array of tri-state buffers includes a second input to receive the low-pass filtered signal, wherein the second plurality of arrays of tri-state buffers each includes a third input to receive a corresponding one of the plurality of band-pass filtered signals, and wherein the first plurality of arrays of tri-state buffers include a plurality of respective output enable inputs to independently control respective selection of the high-pass filtered signal, low-pass filtered signal, and plurality of band-pass filtered signals for transmission on the device output.

8. The digital filter bank device of claim 7, wherein the low-pass filtered output signal is one of a sequence of low-pass filtered feedback signals, and the low-pass filtered signal received by the second array of tri-state buffers is a final low-pass filtered feedback signal in the sequence of low-pass filtered feedback signals.

9. The digital filter bank device of claim 2, wherein each of the filters includes first and second signal selectors, a pole signal processor, a parallel-to-serial converter, a shift register, first and second memories, and a zero signal processor, wherein:

the first signal selector includes a first input to receive the filter input signal, a second input to receive a first memory data output from the first memory, and an output to selectively provide the first memory data output as a first selected signal, the pole signal processor includes a first input to receive the first selected signal and a second input to receive a second selected output from the second signal selector, wherein said pole signal processor generates a pole signal for inclusion in the summations of product terms according to the distributed arithmetic algorithm, the second signal selector has a first input to receive the pole signal, a second input to receive the first memory data output, and an output to transmit the selected first memory data output as a second selected signal, the parallel-to-serial converter has an input to receive the pole signal, wherein said parallel-to-serial converter converts the pole signal from a parallel format to a serial format including a plurality of bits of data, the shift register has an input to receive the serial format pole signal, and includes an address synthesizer to form first and second memory addresses using bits of data of the serial format pole signal, the first memory includes first addressing logic to retrieve first digital filter characteristic coefficient data stored in the shift register means and to store the retrieved first digital filter characteristic coefficient data as first memory data, the second memory includes second addressing logic to retrieve second digital filter characteristic coefficient data stored in the shift register means and to store the retrieved second digital filter characteristic coefficient data as second memory data, and the zero signal processor includes an input to receive the second memory data, processing logic to process the second memory data as summations of product terms according to the distributed arithmetic algorithm, and an output port to provide the processed second memory data as the high-pass filtered signal and the low-pass filtered signal.

10. The digital filter bank device of claim 9, wherein the zero signal processor output port provides the processed second memory data as the high-pass filtered signal, the low-pass filtered signal, and a band-pass filtered signal.

11. The digital filter bank device of claim 10, wherein the first signal selector includes first and second arrays of tri-state buffers having respective first and second output lines, wherein the first and second output lines are tied to form a first select output, and wherein the first and second arrays of tri-state buffers include respective first and second output enable inputs to independently control provision of the first selected signal to the first select output.

12. The digital filter bank device of claim 10, wherein the second signal selector includes first and second arrays of tri-state buffers having respective first and second output lines, wherein the first and second output lines are tied to form a second select output, and wherein the first and second arrays of tri-state buffers include respective first and second output enable inputs to independently control provision of the second selected signal to the second select output.

13. The digital filter bank device of claim 10, wherein the pole signal processor comprises an array of registers, an array of adders, a set of stage register arrays, and an array of AND-OR logic gates, wherein:

the set of stage register arrays includes an input circuit to receive the second selected signal and to latch the second selected signal for provision to the array of AND-OR logic gates, the array of AND-OR logic gates includes an input port to receive the latched second selected signal, a signal conditioner to condition the latched second selected signal, and an output port to provide the conditioned second selected signal to the array of adders, the array of adders includes a first input port to receive the conditioned second selected signal, a second input port to receive the first selected signal, and addition logic to add the conditioned second selected signal and the first selected signal to generate a selected signal sum for provision to the array of registers, and the array of registers includes an input circuit to receive the selected signal sum and to latch the selected signal sum as the pole signal, according to a clock signal.

14. The digital filter bank device of claim 10, wherein the first memory is a read-only memory.

15. The digital filter bank device of claim 10, wherein the second memory is a read-only memory.

16. The digital filter bank device of claim 10, wherein the first memory is a programmable array logic memory device.

17. The digital filter bank device of claim 10, wherein the second memory is a programmable array logic memory device.

18. The digital filter bank device of claim 9, wherein the zero signal processor includes an array of registers, an array of adders, a set of stage register arrays, and an array of AND-OR logic gates, wherein:

the array of AND-OR logic gates includes an input port to receive a register output from the set of stage register arrays, a signal conditioner to condition the register output to produce a conditional pole signal, an output port to provide the conditioned pole signal to the array of adders, the array of adders includes an input port to receive the conditioned pole signal and the second memory data, addition logic to add the conditioned pole signal and the second memory data to produce a summation, and an output port to provide the summation to the array of registers, the array of registers includes an input circuit to receive and latch the summation, and synchronous logic to provide the summation to the set of stage register arrays according to a clock signal, and the set of stage register arrays includes an input port to receive the latched summation, and output circuitry to provide the latched summation to the frequency bank selector as the high-pass filtered signal and the low-pass filtered signal.

19. The digital filter bank device of claim 18, wherein the zero signalling processor further includes output circuitry to provide the latched summation to the frequency bank selector as a band-pass filtered signal.

20. The digital signal filter bank device of claim 1, wherein the filter bank includes a plurality of filter organized as a plurality of banks of filters, wherein the plurality of filters generate a plurality of filtered outputs having a plurality of frequency bands, and wherein each of the plurality of frequency bands, at most, slightly overlaps another of the plurality of frequency bands.

21. The digital signal filter bank device of claim 1, further comprising an analog-to-digital converter to convert the external input signal to a digital format for processing by the input signal selector.

22. The digital signal filter bank device of claim 1, wherein the input signal selector includes first and second arrays of tri-state buffers having respective first and second output lines, wherein the first and second output lines are tied to form a selector output line to carry the filter input signal, wherein the first array of tri-state buffers includes a first input to receive the external input signal, wherein the second array of tri-state buffers includes a second input to receive the low-pass filtered feedback signal, and wherein the first and second arrays of tri-state buffers include an output enable input to control selection between the external input signal and the low-pass filtered feedback signal, to provide the filter input signal.

23. The digital signal filter bank device of claim 1, wherein the low-pass filtered feedback signal is a plurality of feedback signals, wherein the input signal selector includes a first plurality of arrays of tri-state buffers having a first plurality of output lines, wherein the first plurality of arrays includes
- a first array of tri-state buffers having a corresponding first output line, and
- a second plurality of arrays of tri-state buffers having a respective second plurality of output lines;

wherein the first plurality of output lines are tied to form a selector output to carry the filter input signal, wherein the first array of tri-state buffers includes a first input to receive the external input signal, wherein the second plurality of arrays each includes a second input to receive a corresponding one of the plurality of feedback signals, and wherein the first plurality of arrays of tri-state buffers includes an output enable input to control selection between the external input signal and the plurality of feedback signals, to provide the filter input signal.

24. The digital signal filter bank device of claim 1, wherein the frequency band selector includes first and second arrays of tri-state buffers having respective first and second output lines, wherein the first and second output lines are tied to form a device output to carry the device output signal, wherein the first array of tri-state buffers includes a first input to receive the high-pass filtered signal, wherein the second array of tri-state buffers includes a second input to receive the low-pass filtered signal, and wherein the first and second arrays of tri-state buffers include respective first and second output enable inputs to independently control respective selection of the high-pass filtered signal and the low-pass filtered signal for transmission on the device output.

25. The digital filter bank device of claim 24, wherein the low-pass filtered output signals is one of a sequence of low-pass filtered feedback signals and the low-pass filtered signal received by the second array of tri-state buffers is a final low-pass filtered feedback signal in the sequence of low-pass filtered feedback signals.

* * * * *